(12) United States Patent
Dubuc et al.

(10) Patent No.: US 7,428,270 B1
(45) Date of Patent: Sep. 23, 2008

(54) METHOD AND SYSTEM FOR DETECTING AND CLASSIFYING THE MODULATION OF UNKNOWN ANALOG AND DIGITAL TELECOMMUNICATIONS SIGNALS

(76) Inventors: Christian Dubuc, 92 Des Jonquilles, Hull PQ (CA) J9A 2J3; Daniel Boudreau, 15 Helmer, Hull PQ (CA) J8Y 1H3

( * ) Notice: Subject to any disclaimer, the term of this patent is extended or adjusted under 35 U.S.C. 154(b) by 0 days.

(21) Appl. No.: 09/504,676

(22) Filed: Feb. 15, 2000

(30) Foreign Application Priority Data

Feb. 15, 1999 (CA) ................................. 2260336

(51) Int. Cl.
*H04L 27/06* (2006.01)
*H04L 27/14* (2006.01)
*H04L 27/22* (2006.01)
*H04B 17/00* (2006.01)

(52) U.S. Cl. .................. 375/316; 375/224; 375/344; 455/226.1

(58) Field of Classification Search ................. 375/316, 375/320, 344, 224, 322; 455/226.1
See application file for complete search history.

(56) References Cited

U.S. PATENT DOCUMENTS

| | | | |
|---|---|---|---|
| 4,166,980 A | | 9/1979 | Apostolos et al. |
| 4,227,255 A | | 10/1980 | Carrick et al. |
| 4,501,020 A | | 2/1985 | Wakeman |
| 4,597,107 A | * | 6/1986 | Ready et al. ............ 455/226.1 |
| 4,815,137 A | | 3/1989 | Benvenuto |
| 4,845,707 A | | 7/1989 | Isaacson et al. |
| 4,979,211 A | | 12/1990 | Benvenuto et al. |
| 5,271,036 A | | 12/1993 | Lobert et al. |
| 5,353,346 A | | 10/1994 | Cox et al. |
| 5,636,250 A | | 6/1997 | Scarpa |
| 5,651,030 A | | 7/1997 | Wong et al. |
| 5,870,735 A | | 2/1999 | Agrawal et al. |
| 5,909,675 A | | 6/1999 | Chiodini |
| 5,912,922 A | | 6/1999 | Koszarsky et al. |

OTHER PUBLICATIONS

C. Y. Huang and A. Polydoros, "Likelihood Methods for MPSK Modulation Classification", *IEEE Transactions on Communications*, vol. 43, Nos. 2, 3 and 4, (1985), 1493-1504.

(Continued)

*Primary Examiner*—Stephen Chin
*Assistant Examiner*—David B. Lugo
(74) *Attorney, Agent, or Firm*—Varnum, Riddering, Schmidt & Howlett LLP

(57) ABSTRACT

Disclosed is a unique system and method for recognizing the type of modulation embedded in an unknown complex baseband signal, comprising a receiver section for extracting the complex baseband signal from a modulated signal having a carrier frequency, and comprising an orderly series of signal processing functions for (a) estimating the bandwidth of the unknown signal, (b) removing the out-of-band noise and correcting gross carrier frequency errors, (c) discriminating between constant envelope and irregular envelope signals, (d) estimating and correcting residual carrier frequency errors, (e) classifying a constant envelope signal into one of the following modulation formats: {Continuous Wave (CW), Frequency Modulation (FM), Frequency Shift Keying (FSK) }, and (f) classifying an irregular envelope signal into one of the following modulation formats: {Amplitude Modulation (AM), Double Sideband Suppressed Carrier (DSB-SC), Binary Shift Keying (BPSK), Quaternary Phase Shift Keying (QPSK), π/4-shifted QPSK, M-ary PSK (MPSK), and OTHER classes}.

24 Claims, 10 Drawing Sheets

OTHER PUBLICATIONS

A. K. Nandi and E. E. Azzouz, "Algorithms for Automatic Modulation Recognition of Communication Signals", *IEEE Transactions on Communications*, vol. 46, No. 4, (Apr. 1998), 431-436.

E. E. Azzouz and A. K. Nandi, "Automatic Modulation Recognition—I & II", *J. Franklin Institute*, vol. 334B, No. 2, (1997), 241-305.

* cited by examiner

METHOD AND SYSTEM FOR DETECTING AND CLASSIFYING THE MODULATION OF UNKNOWN ANALOG AND DIGITAL TELECOMMUNICATIONS SIGNALS

FIELD OF THE INVENTION

The invention relates in general to telecommunications and in particular to the classification of modulation schemes embedded in unknown telecommunications signals, typically: CW, FM, PSK, AM, DSB-SC, BPSK, QPSK, π/4-QPSK, MPSK, NOISE, OTHERS.

BACKGROUND OF THE INVENTION

Automatic recognition of the modulation scheme embedded in an unknown received signal is an important requirement for civilian, military, and government intelligence bodies when monitoring the radio communication spectrum. Although the subject has been extensively researched for several years and different approaches have been implemented or delineated in theoretical papers, the prior art has traditionally assumed that (a) the carrier frequency of the unknown received signal is given and has zero error, that (b) the input Signal-to-Noise Ratio (SNR) is sufficiently high to classify the modulation correctly, and that (c) the symbol transition of digitally-modulated signals is known. Furthermore, the more recent prior art approaches are limited to off line operation on stored signals. Some of the recent methods employ probabilistic models to minimize misclassification errors, which can achieve good results at SNRs that are as low as 0 dB. As shown in reference [1], however, they assume a priori knowledge of the carrier phase and frequency, the SNR, and the symbol rate of the modulation, and are often limited to digital phase modulation schemes.

Other approaches to automatic classification use statistical pattern recognition techniques, such as Artificial Neural Networks (ANN), to discern discriminating features. As shown in references [2], [3], and [4], ANN classifiers produce reasonably good results under simulated conditions, but their practical behaviour is highly dependent on the training set chosen. Since they can perform learning vector quantization, neural networks are capable of achieving an efficient class definition over a large multi-dimensional feature space. The inherent problem however, is that ANN classifiers have difficulty indentifying the set of meaningful features and to train the network accordingly. Furthermore, the designer does not have much manipulative control over the classification algorithm and may have difficulty applying a priori knowledge of the taxonomy of the modulation schemes. A neural network operates like a black box that requires a new training phase when new features (or signals) to be identified are added. Examples of ANN techniques are described in [4].

Other, more recent, prior art approaches to modulation recognition base their classification decisions on a number of successive serial tests, each yielding a binary output. As described in references [2], [3], and [4], such methods give rise to a decision tree in which the outcome of the first binary decision forces a second binary decision whose outcome determines the next binary decision, etc. This decision tree technique represents an improvement over the vector-based methods described above in that it refines and clarifies, in successive decision levels, the information extracted from the unknown input signal. Its hierarchical structure allocates the computing resources more efficiently. As well, the thresholds established at each decision level may be quickly modified in order to reflect operational changes. These alterations can improve performance accuracy. Notwithstanding these advantages, the decision tree methods published to-date have inherent deficiencies, namely their intolerance to carrier frequency errors, their erratic performance at low SNRs, and their inability to classify modulation schemes reliably under real-time operations.

Other forms of classification techniques are described in the following U.S. patents:

In reference [5], the classifier of an IF signal takes the outputs of the two separate demodulators (one AM, the other FM) to compute different signal statistics (or features) and make six binary decisions based on those statistics. It then classifies the modulating scheme, within a set consisting of CW, DSB, SSB, ASK, FSK, MUX, NOISE, and OTHERS, by using the whole vector of six binary decisions as an input to a logic circuit. The drawback to this method is that it usually performs the computation of the vector features in parallel, without any interaction between these features. It also uses a sub-optimum classification circuit.

In reference [6], the probability distribution of the input signal amplitude is analyzed to estimate the mean, the variance and the amplitude cumulative distribution. This information is combined with the outputs of three phase-locked loops—one tailored to AM signals, one to FM signals and one to DSB signals. The combined information is compared with a number of thresholds to form an information vector which is then compared to a pre-stored series of vectors representing the modulations within the set CW, AM, FM, DSB, SSB, PSK. The main difference between this method and the present invention is the computationally-intensive parallel processing of the feature vector, as opposed to serial processing of the vector which is less computer hungry.

In reference [7], several parameters, including the mean amplitude, the signal-to-noise ratio, and the standard deviation, are computed for each of the frequency lines of the input signal's power spectrum. These parameters are fed in parallel to a neural network for the classification of the input modulation. The main drawback of this method is that it performs the computation of the vector features in parallel over a limited set of features.

In reference [8], the normalized variance of the magnitude of the input baseband signal is computed and compared to a predetermined threshold in order to decide in favour of one of the following modulation types: FSK, FM or QAM. This method is limited by the number of modulation schemes it can identify. As well, it uses only a single feature to perform the identification.

In reference [9], histograms based on the power spectrum of the input signals are computed. Frequency locations and amplitudes are recorded, as well as the location of the centre frequency of the overall spectrum. The particular patterns of each histogram are compared to those of typical modulation schemes, such as AM, FSK, PSK or SSB. The main drawback of this method is that it uses only the spectral representation of the signal to perform its computation.

In reference [10], a method is used to discriminate between an FM signal and a π/4-DQPSK signal in analog AMPS and digital DAMPS systems. The variation in amplitudes of the two different modulation types determines which one is present. The main problem with this method is that it is limited to only two modulation types.

In reference [11], the method uses a neural network to demodulate the signal of a particular digital communication standard. This method differs from the present invention in that it identifies the information content of the signal instead of its format.

In reference [12], a method is used to discriminate between the VSB and QAM signals that are encountered in High Definition TV. The main deficiency with this method is that it is limited to the two modulation schemes it can identify.

In reference [13], the spectral energy distribution of the input signal is compared with the pre-stored energy distributions of FDM/FM signals containing specific parameters. Recognition of a specific form of signal is declared if the input distribution matches one of the pre-stored versions. This method is limited to a single form of signal feature and to a very specific modulation format.

In reference [14], the demodulated signal of an FM receiver is classified according to the voice coding algorithm that processed it. This method differs from the present invention because classification is applied on the demodulated signal.

In reference [15], a method is used to generate a decision-tree classifier from a set of records. It differs from the present invention in that it does not consider the specific classification of modulation formats.

Reference [16] describes a method and apparatus for detecting and classifying signals that are the additive combination of a few constant-amplitude sinusoidal components. The main drawback of this scheme is that it cannot be applied to the modulations treated under the present invention, except for CW.

In reference [17], a sequence of estimated magnitudes is generated from the received signal at the symbol rate, and the result is compared to a predetermined representation of known voiceband digital data modem signals. This method is limited to a single decision level, as opposed to the series of binary decisions performed under the present invention.

PRIOR ART REFERENCES

[1] C. Y. Huang and A. Polydoros, "Likelihood Methods for MPSK Modulation Classification", *IEEE Transactions on Communications*, Vol. 43, Nos. 2, 3 and 4, (1985), 1493-1504.

[2] E. E. Azzouz and A. K. Nandi, "Automatic Modulation Recognition of Communications Signals", *Klewer Academic Press*, (1996), 217.

[3] A. K. Nandi and E. E. Azzouz, "Algorithms for Automatic Modulation Recognition of Communication Signals", *IEEE Transaction On Communications*, Vol. 46, No. 4, (April 1998), 431-436.

[4] E. E. Azzouz and A. K. Nandi, "Automatic Modulation Recognition—I & II", *J. Franklin Institute*, Vol 334B, No 2, (1997), 241-305.

[5] Robert L. Carrick, William T. Manning and Robert E. Grimes, U.S. Pat. No. 4,227,255, Oct. 7, 1980, "Signal Classifier".

[6] Philip E. D. Wakeman, U.S. Pat. No. 4,501,020, Feb. 19, 1985, "Spectrum Surveillance Receiver System".

[7] Bruno Lobert and Bruno Sourdillat, U.S. Pat. No. 5,271,036, Dec. 14, 1993, "Method and Device for the Recognition of Modulations".

[8] Nevio Benvenuto, U.S. Pat. No. 4,815,137, Mar. 21, 1989, "Voiceband Signal Classification".

[9] John T. Apostolos and Robert P. Boland, U.S. Pat. No. 4,166,980, Sep. 4, 1979, "Method and Apparatus for Signal Recognition".

[10] Christopher Koszarsky, John Northcutt and Michael Nowak, U.S. Pat. No. 5,912,922, Jun. 5, 1999, "Method and Apparatus for Modulation Differentiation".

[11] Alain Chiodini, U.S. Pat. No. 5,909,675, Jun. 1, 1999, "Device for Recognizing Information Conveyed by a Received Signal".

[12] Carl G. Scarpa, U.S. Pat. No. 5,636,250, Jun. 3, 1997, "Automatic VSB/QAM Modulation Recognition Method and Apparatus".

[13] Ronald L. Isaacson and Amy L. Moore-McKee, U.S. Pat. No. 4,845,707, Jul. 4, 1989, "Frequency Division Multiplex/FM Modulation Recognition System".

[14] Chin-Pan Wong and Richard S. Young, U.S. Pat. No. 5,651,030, Jul. 22, 1997, "Receiver with Signal Classifier".

[15] Rakesh Agrawal and Manish Mehta, John C. Shafer, U.S. Pat. No. 5,870,735, Feb. 9, 1999, "Method and System for Generating a Decision-Tree Classifier in Parallel in a Multi-Processor System".

[16] Neil B. Cox and Edwin L. Froese, U.S. Pat. No. 5,353,346, Oct. 4, 1994, "Multi-Frequency Signal Detector and Classifier".

[17] Nevio Benvenuto and Thomas W. Goeddel, U.S. Pat. No. 4,979,211, Dec. 18, 1990, "Classifier for High Speed Voiceband Digital Modem Signals".

SUMMARY OF THE INVENTION

It is now an object of the invention to provide a more straightforward and computationally simpler method of modulation recognition than neural network based methods.

It is another object of the invention to provide a modulation recognition method which directly exploits the fundamental principles of the decision tree based methods in order to automatically and accurately perform recognition of a wide variety of modulation formats that are embedded in unknown communications signals. These modulation formats comprise the following set: CW, AM, FM, FSK, DSB-SC, BPSK, QPSK, $\pi$/4-QPSK, MPSK, NOISE, and OTHERS.

It is a further object of the present invention to provide a modulation recognition method that successfully classifies the signal's embedded modulation amid SNRs as low as 5 dB, carrier frequency errors up to +/−50% of the sampling rate, and carrier phase errors up to +/−180 degrees—all without a priori knowledge of the symbol transition timing of the signal.

It is a further object of the invention to extract the digital complex baseband of unknown signals that are measured off-air in real-time, on-line in real-time, or from storage, and then accurately classify the signal's embedded modulation through an orderly series of decision functions.

It is still a further object of the invention to provide a system for recognizing the type of modulation of a modulated signal having a carrier frequency comprising:

(a) a receiver section for extracting from the modulated signal a complex baseband signal;

(b) a pre-classification stage for generating a pre-processed signal from the baseband signal;

(c) means for examining amplitude variations in the pre-processed signal to identify the type of envelope thereof as being one of a constant envelope and one of an irregular envelope;

(d) means for estimating the carrier frequency error in the pre-processed signal;

(e) means for correcting the pre-processed signal for the carrier frequency errors to generate a carrier-corrected signal;

(f) means for classifying the type of modulation in the carrier-corrected signal, based on the type of envelope identified in the examining step.

(g) means for classifying the type of modulation embedded in a constant envelope signal according to the phase and frequency contents of the pre-processed and carrier-corrected signals, such modulations being categorized within the set {CW, FSK and FM}; and (h) means for classifying the type of modulation embedded in an irregular envelope signal according to the phase and amplitude contents of the carrier-corrected signal, such modulations being categorized within the set {AM, DSB-SC, BPSK, QPSK, π/4-QPSK, MPSK, OTHER}.

The method of the invention provides a unique decision tree architecture that automatically performs recognition of a wide variety of embedded modulation formats in unknown communications signals. The principal method of the invention extracts the digital complex baseband of the unknown signal and then determines and classifies, through an orderly series of signal processing functions, the signal's embedded modulation scheme with a high degree of accuracy. Without knowledge of the symbol transition timing, the method of the invention can be used for successfully performing modulation recognition of measured signals amid SNR's as low as 5 dB, carrier frequency errors of up to +/−50% of the sampling rate, and carrier phase errors of up to +/−180 degrees. The tolerance to carrier frequency errors is limited only by the frequency bandwidth of the unknown signal, since the only requirement is to prevent the frequency error from shifting the input signal outside of the sampling bandwidth of ± half of the sampling rate. The preferred method according to the invention is computationally simple, making it possible to observe the signal during a time frame of preferably less than 100 msecs. The modular architecture of the method of the invention allows for expansion of new modulation classifiers.

BRIEF DESCRIPTION OF THE DRAWINGS

Exemplary embodiments of the invention will now be described in more detail with reference to the appended figures, in which the referenced numerals designate similar parts throughout the figures thereof, and wherein.

DETAILED DESCRIPTION OF THE INVENTION

Glossary of Acronyms

Figure 1:
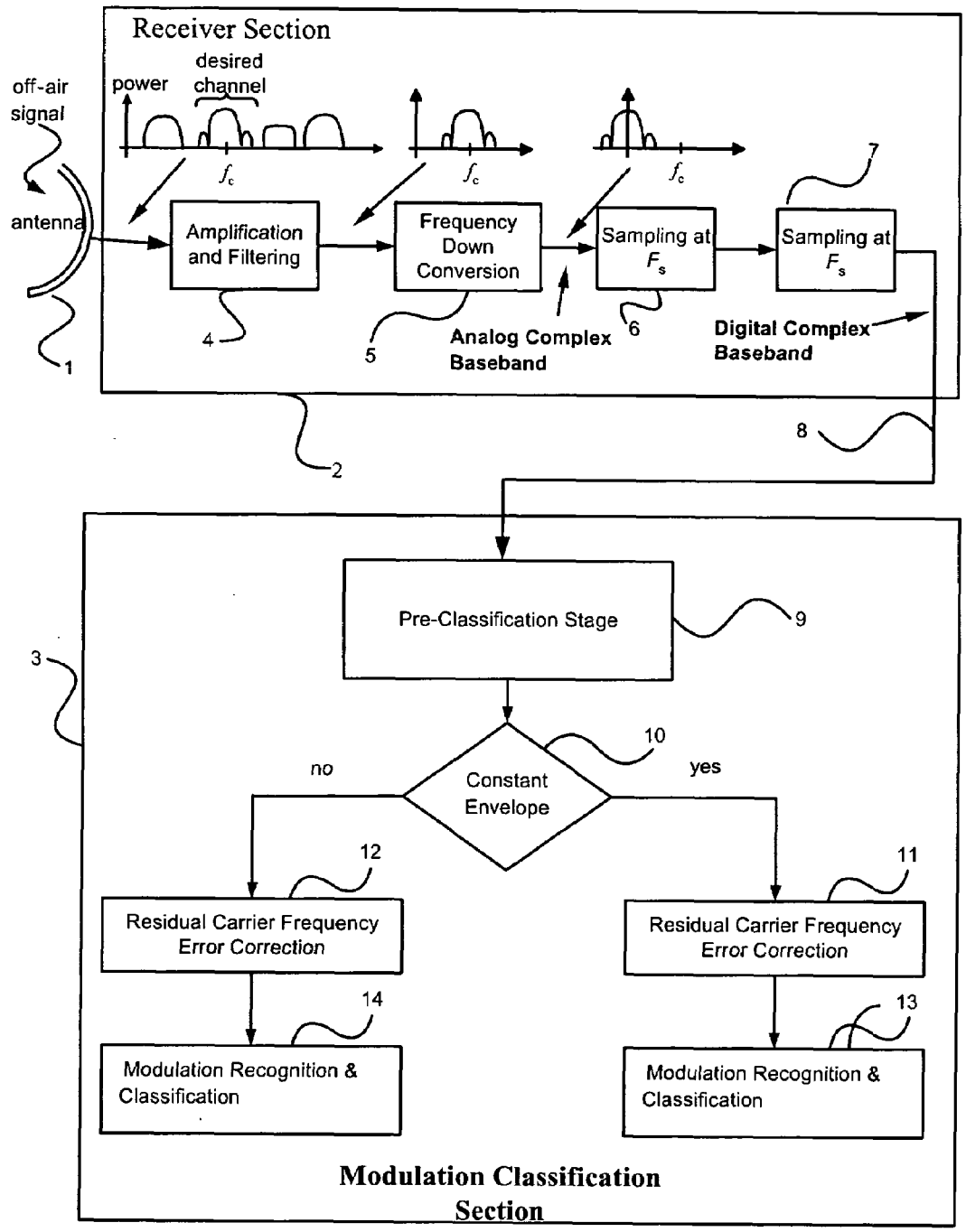
FIG. 1 is a top-level block diagram that illustrates an embodiment of the present invention for measuring and classifying an off-air unknown signal.

For convenience, a glossary of acronyms used in the description of the present invention is given below:

| | |
|---|---|
| AM | Amplitude Modulation |
| AMPS | Advanced Mobile Phone Services |
| ASK | Amplitude Shift Keying |
| AWGN | Additive White Gaussian Noise |
| BPSK | Binary Phase Shift Keying |
| BT | Product of a filter bandwidth B and the symbol period T |
| BW | Bandwidth |
| CW | Continuous Wave |
| DSB | Double Sideband |
| DSB-SC | Double Sideband Suppressed Carrier |
| FFT | Fast Fourier Transform |
| FSK | Frequency Shift Keying |
| FM | Frequency Modulation |
| GMSK | Gaussian Minimum Shift Keying |
| GSM | Global System for Mobile (Pan European Digital Cellular) |
| IS-54 | Interim Standard #54 of the Telecommunications Industry Association (also known as US Digital Cellular) |
| MPSK | M-ary PSK |
| MUX | Multi-Channel or Multiplexing |
| PSD | Power Spectral Density |
| PSK | Phase Shift Keying |
| QAM | Quadrature Amplitude Modulation |
| QPSK | Quarternary Phase Shift Keying |
| π/4-QPSK | π/4-shifted Quaternary Phase Shift Keying |
| RMS | Root Mean Square |
| SNR | Signal to Noise Ratio |
| SSB | Single Side Band |
| VCO | Voltage Control Oscillator |
| VSB | Vestigial Sideband |

Terminology

Throughout the description of the present invention the following terms are used in accordance with their respective definitions given below:

Linear vector quantization "Vector quantization" is a process by which a vector, defined over a continuous multi-dimensional vector space, is assigned one of a limited number of pre-determined representative vectors. Quantization occurs at the vector level because an infinite number of vector possibilities is mapped onto an ensemble containing a finite number of vectors. The mapping is performed by dividing the original vector space into a number of regions, each of which corresponding to one of the finite number of pre-determined representative vectors. "Learning vector quantization" is the process that performs the adaptive segmentation of the infinite vector space in the pre-determined regions during a training period or during normal operation of the quantizer.

Training set The training set is an ensemble of known vectors, signals, or other inputs provided to a system that estimates certain parameters over the inputs. The system's internal state is thus allowed to adapt to the training set so that it can thereafter perform parametric estimations on unknown inputs.

Centroid frequency The centroid frequency of a given power spectral density is the frequency corresponding to the "centre of mass" of such power spectral density. It is a purely geometric property of a given density and is expressed as:

$$\hat{f} = \frac{1}{\sum_i |c_i|^2} \sum_i f_i |c_i|^2$$

where the $c_i$s are the Discrete Fourier Transform (DFT) coefficients of the input signal and the $f_i$s are the corresponding frequencies.

Zero padding In the computation of the Discrete Fourier Transform (DFT) of a given discrete-time signal vector x(n) of finite length N, zero padding refers to the appending (the padding) of a certain number L of samples (all equal to zero) at the end of the vector x(n). The DFT is then computed on a new discrete-time signal vector [x(n) 0 0 0 . . . 0], of length N+L. This process has the effect of increasing the frequency resolution of the original N-point DFT, since it is then computed for N+L different frequencies over the same frequency range.

Unwrapped phase Unwrapping the phase of a complex signal vector refers to the process of making the corresponding modulo-$2\pi$ phase vector continuous over the range from minus infinity to plus infinity, by adding multiples of + or $-2\pi$ as needed.

Digital complex baseband The complex baseband representation of signals (also referred to as "complex envelope representation") serves the purpose of mathematically expressing a real bandpass signal in a format which contains the amplitude and phase information of the signal but not its carrier or reference frequency. This representation is an extension of the familiar two-dimensional phasor (vector) representation of sinusoidal signals.

Consider a real bandpass signal with a narrow bandwidth concentrated around a reference or carrier frequency $f_c$. This real signal can be mathematically expressed as:

$$s(t) = a(t)\cos[2\pi f_c t + \phi(t)]$$

where a(t) is the signal amplitude and $\phi(t)$ is the time-varying phase. The modulation of the signal is contained in its amplitude and its phase (the frequency modulation is equal to the time derivative of the phase). The signals a(t) and $\phi(t)$ show all the modulation information carried by s(t), and must be preserved in the complex baseband representation. The above equation can also be expressed as:

$$s(t) = s(t)\cos[\phi(t)]\cos[2\pi f_c t] - a(t)\sin[\phi(t)]\sin[2\pi f_c t]$$

$$= \text{Re}\{[x(t) + jy(t)]e^{j2\pi f_c t}\},$$

Substituting:

$$x(t) = a(t)\cos[\phi(t)]$$

$$y(t) = a(t)\sin[\phi(t)]$$

we then have a signal:

$$u(t) = x(t) + jy(t)$$

$$= a(t)e^{j\phi(t)}$$

which is the complex baseband equivalent of s(t) and contains all the amplitude and phase information of the real bandpass signal.

Overview of Present Invention

FIG. 1 is a top-level block diagram that shows one aspect of the present invention—the measurement of off-air unknown signals. This figure includes an antenna 1, a receiver section 2 and a modulation classification section 3. The receiver section includes an amplifier and filter 4, a frequency down-converter 5, a signal sampling processor 6, and an analog to digital (A/D) converter 7. Each of these receiver circuits are generally recognized in the prior art. The unknown signal, which may comprise a plurality of channels, is collected off-air at the antenna 1 and then amplified and filtered by step 4. This function also serves to isolate the channel containing the desired carrier frequency ($f_c$). The filtered signal is then down-converted in frequency in step 5 to the analog version of the complex baseband signal. While this process reduces $f_c$ to near zero Hz, residual carrier frequency errors still remain within the converted signal and must be dealt with prior to the classification process in order to ensure that the modulation format is accurately recognized. From the down-converter 5, the analog complex baseband signal is sampled by step 6 at regular time intervals of $T_s = 1/F_s$ seconds, and the resulting time samples are quantized by the A/D converter 7 to produce a series of quantized time samples known as the digital complex baseband signal. Quantization is performed within a finite number of levels corresponding to the number of bits of the A/D converter. The digital complex baseband signal 8 is then forwarded to the modulation classification section 3, the principal embodiment of this invention, where the digital signal processing for classifying the modulation schemes begins.

The modulation classifier 3 of FIG. 1 illustrates a simplified view of the modulation classification process, consisting of a pre-classification stage 9, a signal envelope decision test 10, and two separate classification stages—one for processing signals with a constant envelope (11 and 13) and the other for processing signals with an irregular envelope (12 and 14). The purpose of the pre-classification stage 9 is to (a) determine if sufficient signal power is present, (b) estimate the signal's bandwidth and centroid frequency, (c) perform the first level of carrier frequency error correction, and (d) filter the out-of-band background noise power. The first classification test is performed in decision step 10 where constant envelope signals are discriminated from those of irregular shapes. If the signal has a constant envelope, its modulation format is categorized within the set {CW, FSK, FM}. Conversely, if significant envelope variations are detected, the signal's modulation format is categorized within the set {AM, DSB-SC, BPSK, QPSK, π/4-QPSK, MPSK, OTHER}. Following this test, the residual carrier frequency errors superimposed on either signal are cancelled when required, in the error-correction steps 11 and 12 respectively, and the processes for examining, recognizing and classifying the modulation schemes on the respective constant envelope or irregular envelope signals are performed in the classifiers 13 and 14. The phase and frequency content of the constant envelope signal is examined in classifier 13 in order to classify one of the {CW, FSK, FM} modulation formats. The phase and amplitude content of the irregular envelope signal is examined in classifier 14 in order to classify one of the {AM, DSB-SC, BPSK, QPSK, π/4-QPSK, MPSK, OTHER} modulation formats.

Pre-classification Stage

Figure 2:
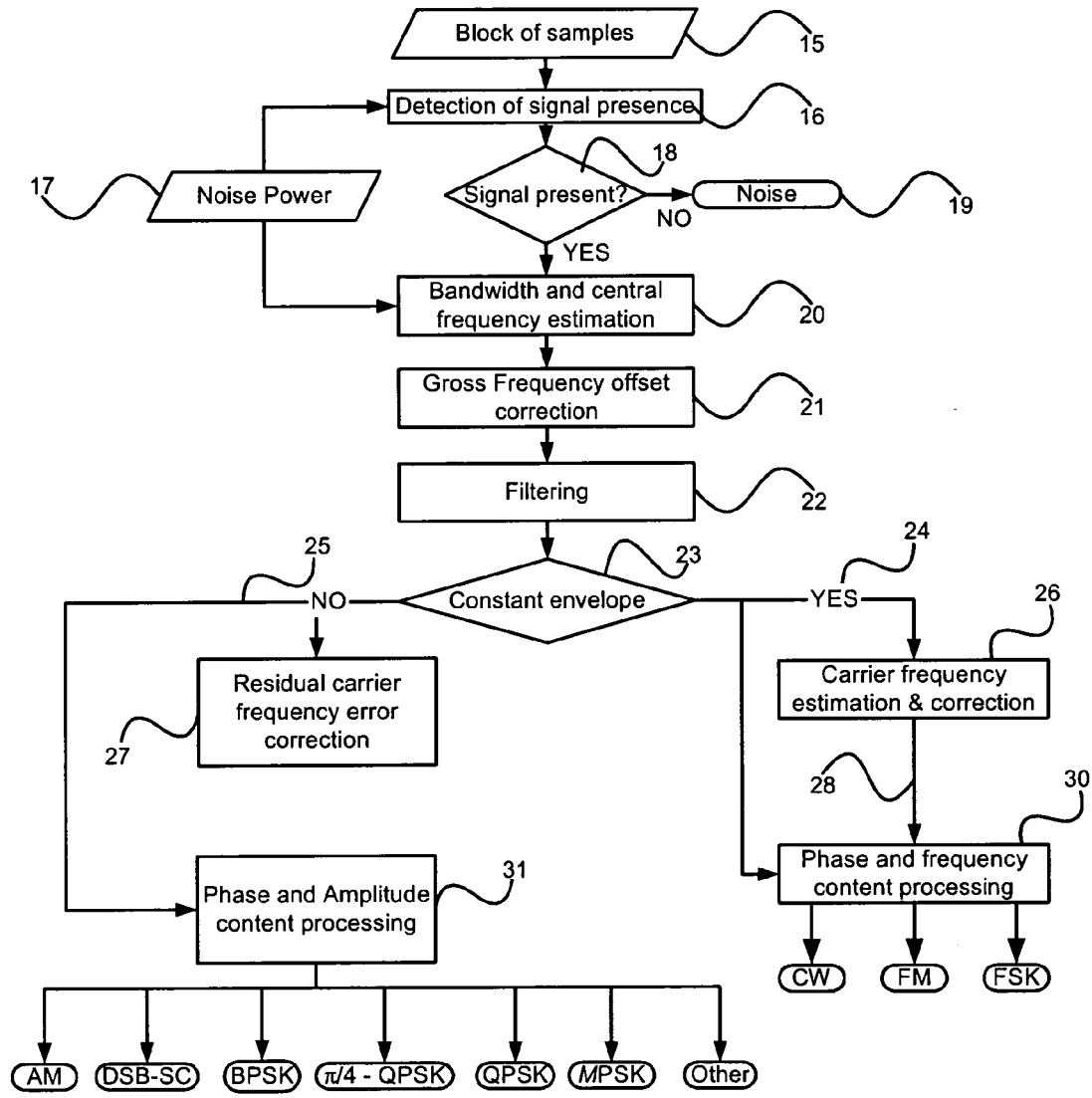
FIG. 2 illustrates, in a top-level flow chart, the modulation classification section shown in FIG. 1.
Figure 3:
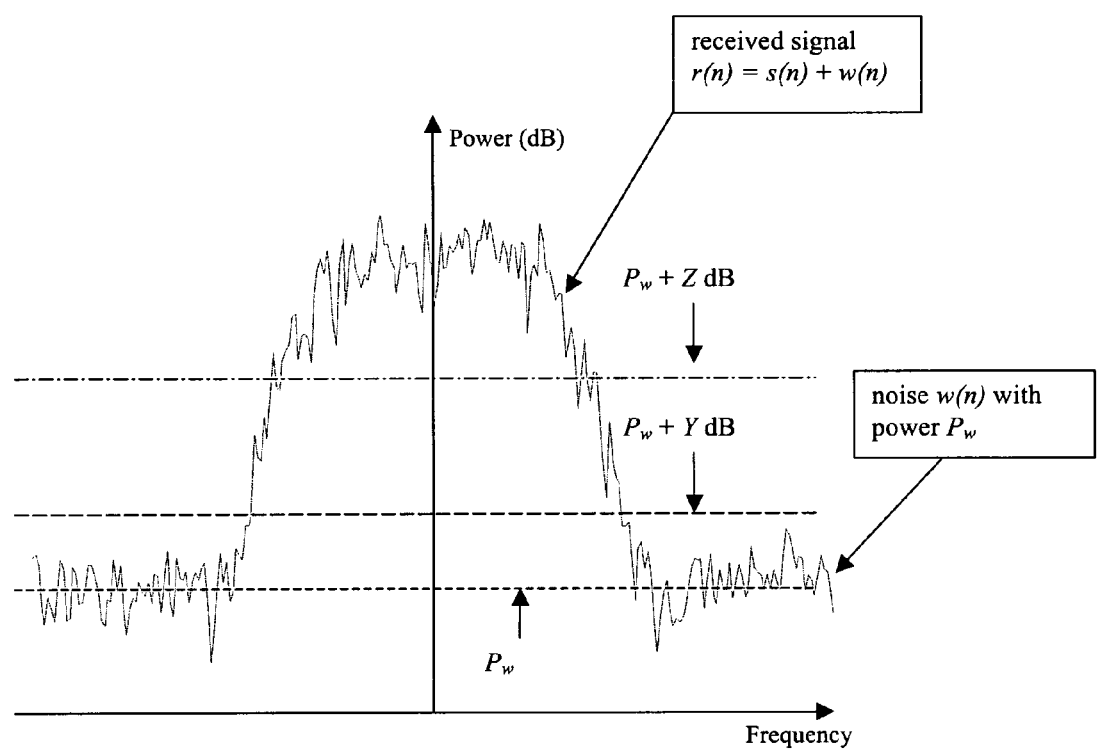
FIG. 3 illustrates a sample of the spectral power density of the signal and embedded noise that can be measured in the pre-classification stage shown in FIG. 1 and detailed in FIG. 2.

FIG. 2 shows in a flow chart a more detailed view of the Modulation Classification Section 3. The process begins at input 15 where a block of digital complex samples is obtained from the output 8 of the Receiver Section of FIG. 1. These samples are forwarded to a signal detector 16 where Fast Fourier processing determines if sufficient signal power is available to establish the presence of a signal. This process is performed with the aid of an external noise power module 17 that establishes a power threshold against which the power spectral density of the observed signal is compared. The noise power 17 is also used in by the BW and centroid estimation process 20 to set another threshold for computing the centroid frequency and estimating the bandwidth of the signal. As illustrated in FIG. 3, the noise power 17 corresponds to the level $P_w$. A signal is declared present at decision step 18 if it bears some frequency components above a threshold ($P_w$+Z) dB, where Z is a given value relating to the probability that a noise frequency component has a power level above the ($P_w$+Z) dB threshold. Thus, if the signal energy is not above the noise-related threshold, the SNR is considered too small to allow further processing and the signal is classified as NOISE 19. However, if a signal is declared present, then the cross estimate of the carrier frequency inherent in the signal is determined in the BW and centroid estimation step 20. This operation is done by computing the centroid of the portion of the power spectral density that is above a certain threshold ($P_w$+Y) dB, as shown in FIG. 3. This threshold is lower than the one used in step 18 to detect the signal presence. Using Fast Fourier processing, the centroid frequency is given by:

$$f_c = \frac{\sum_i f_i \cdot PSD[i]}{\sum_i PSD[i]} \quad (1)$$

where PSD[i] is the power spectral density value corresponding to frequency $f_i$, and the summation is computed for the frequencies corresponding to power spectral density values PSD[i] above the threshold ($P_w$+Y) dB. Frequency translation of the signal is then performed in the gross error correction process 21 where the carrier frequency is corrected by an amount equal to the centroid frequency. The frequency bandwidth is also estimated in step 20. This operation is done by selecting the bandwidth corresponding to a preselected percentage of the sum of the power spectral density values PSD[i] above the given threshold ($P_w$+Y) dB. This estimated bandwidth is then used in step 22 to filter the out-of-band noise power from the frequency-translated signal in step 20. The filter is selected from a bank of pre-stored filters.

Figure 4:
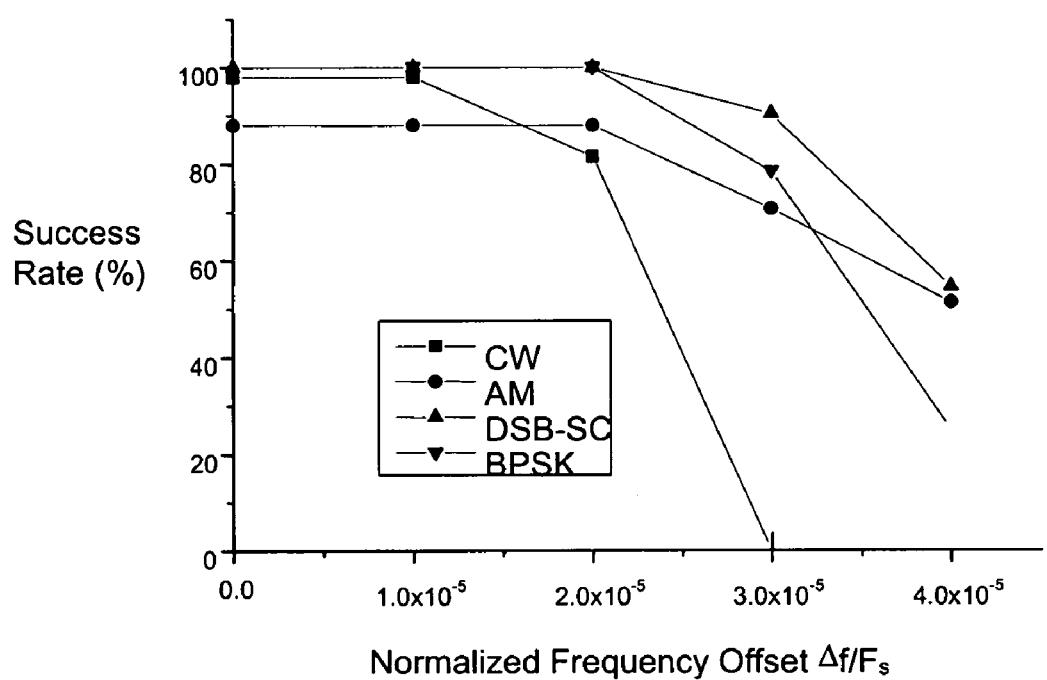
FIG. 4 illustrates in a graph the degradation in the classification success rate of four specific signal types versus the normalized carrier frequency errors, without any provision for correcting the frequency errors in accordance with this invention.

The process for detecting and classifying the modulation format embedded in the signal is performed in steps 23, 30 and 31. Rapid and precise classification is possible provided that the residual carrier frequency error inherent on the output signals 28 and 29 is kept to within 0.001% of the sampling frequency $F_s$ used in sampling step 6 of FIG. 1. This limitation is illustrated in FIG. 4, where the success rate for four different modulation types is maintained at the zero-offset levels for frequency errors up to $10^{-5} \times F_s$. It should be noted, however, that the presence of amplitude variation on the complex baseband signal is insensitive to any phase vector rotation caused by the inherent carrier frequency error. The present invention takes advantage of this feature when discriminating between constant envelope signals and irregular envelope signals in decision test 23. This binary classification test is performed by using the maximum of the squared Fourier Transform on the normalized signal amplitude, given by $$\gamma_{max} = \max_f \frac{|DFT(a)|^2}{N_s} \quad (2)$$

where f is the frequency, DFT(.) is the Discrete Fourier Transform (computed from the Fast Fourier Transform), $N_s$ is the number of samples in the input block, and a is the amplitude vector centred on zero and normalized by its mean. Mathematically, vector a is expressed as $$a = \frac{\overline{x}}{E[|x|]} - 1$$

where x is the observed filtered vector, $\overline{x}$ is the vector of magnitudes for the elements of vector x, and E[|x|] is the average of the magnitude elements over the vector x. The test parameter $\gamma_{max}$ is totally independent of the phase variation in x and is therefore unaffected by residual carrier frequency errors. At the same time, it allows for the identification of information in the signal envelope, which, in most cases of interest, results in the reliable discrimination between constant envelope and irregular envelope signals. The performance obtained in Equation 2 is very good for SNRs as low as 5 dB, where the SNR is defined over the sampling bandwidth.

Frequency Error Correction of Constant Amplitude Signals

Figure 5:
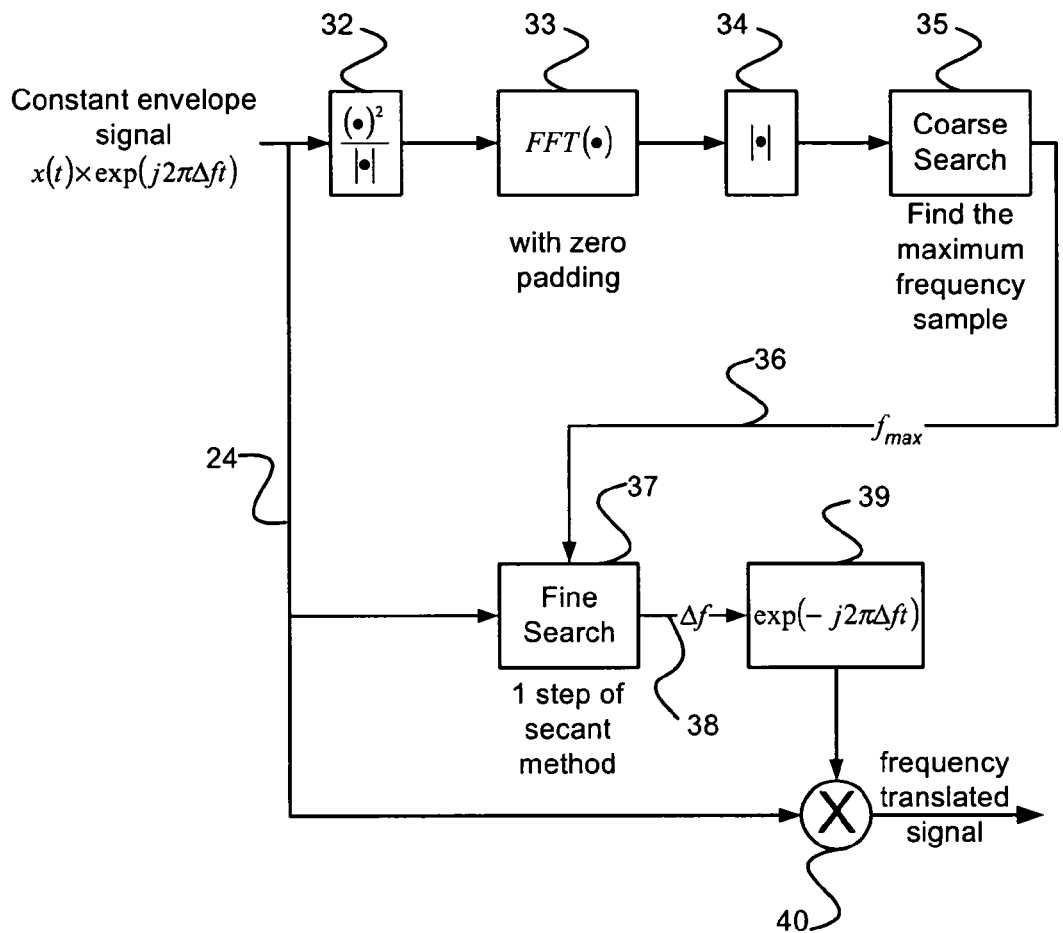
FIG. 5 is a block diagram illustrating the signal processing functions in the error correction block 26 of FIG. 2 for correcting the residual carrier frequency error inherent in a constant envelope signal.

When test 23 determines that the signal has a constant envelope, the process moves to the error-correction step 26 where the residual carrier frequency error is estimated and corrected. The purpose of step 26 is to cancel out the carrier frequency error inherent in the constant amplitude signal 24 in order to determine if the signal is a continuous wave (CW or pure tone). Recognition and classification of a CW signal cannot be performed on the constant envelope signal unless its inherent carrier frequency error has been corrected. The operation is performed in the frequency domain as shown in FIG. 5, consisting of three signal processing operations: a coarse estimation of the carrier frequency (32, 33, 34 and 35); a refined estimation of the carrier frequency (37); and the carrier frequency error correction of the constant envelope signal (39 and 40). The process begins at step 32 where the normalized squared signal is computed. The result is then processed by a Fast Fourier Transform (FFT) 33 with zero padding, squared in step 34, and forwarded to a coarse frequency estimator 35 where a search is done to locate the frequency line with maximum power. Note that both the zero padding and the squaring of the output of the FFT improve the frequency resolution of the coarse frequency estimator 35. The output 36, denoted by $f_{max}$, is forwarded to a fine frequency estimator 37 where the refined estimation of the carrier frequency is performed. This signal processor (37) also receives the constant envelope signal 24 and computes the estimated residual carrier frequency error Δf at 38, as follows:

$$\Delta f = \frac{f_1 \cdot PSDD[f_{\max}] - f_{\max} \cdot PSDD[f_1]}{PSDD[f_{\max}] - PSDD[f_1]} \quad (3)$$

where PSDD[f] is the derivative of the power spectral density at frequency f, and $f_1$ is a frequency given by $$f_1 = f_{max} \pm F_s/2N$$

where $F_s$ is the sampling frequency and N the number of samples used in the FFT (that is, including zero padding). The plus sign is selected for $f_1$ if PSDD[$f_{max}$] is positive, and the negative sign is selected if PSDD[$f_{max}$] is negative. PSDD[.] is obtained as $$PSDD[f] = 2Re[S'(f)S^*(f)]$$

where Re[.] indicates the real part, S(f) is the Discrete Fourier Transform (DFT) of the filtered observed signal at 24, S*(f) is its complex conjugate, and S'(f) is its first derivative with respect to frequency, given by $$S'(f) = \sum_{k=1}^{N} -jk \; x_k \; \exp\left[-j\frac{2\pi kf}{F_s}\right]$$

where $x_k$ is a sample of the filtered observed signal vector at 24 and N is the number of samples in the input vector.

The estimated frequency error Δf at 38 is used to set the frequency of a digital VCO 39. The output of this VCO is then multiplied by the constant envelope signal 24 in a multiplier 40 to cancel out the signal's residual carrier frequency error.

Classification of Constant Envelope Signals

Figure 6:
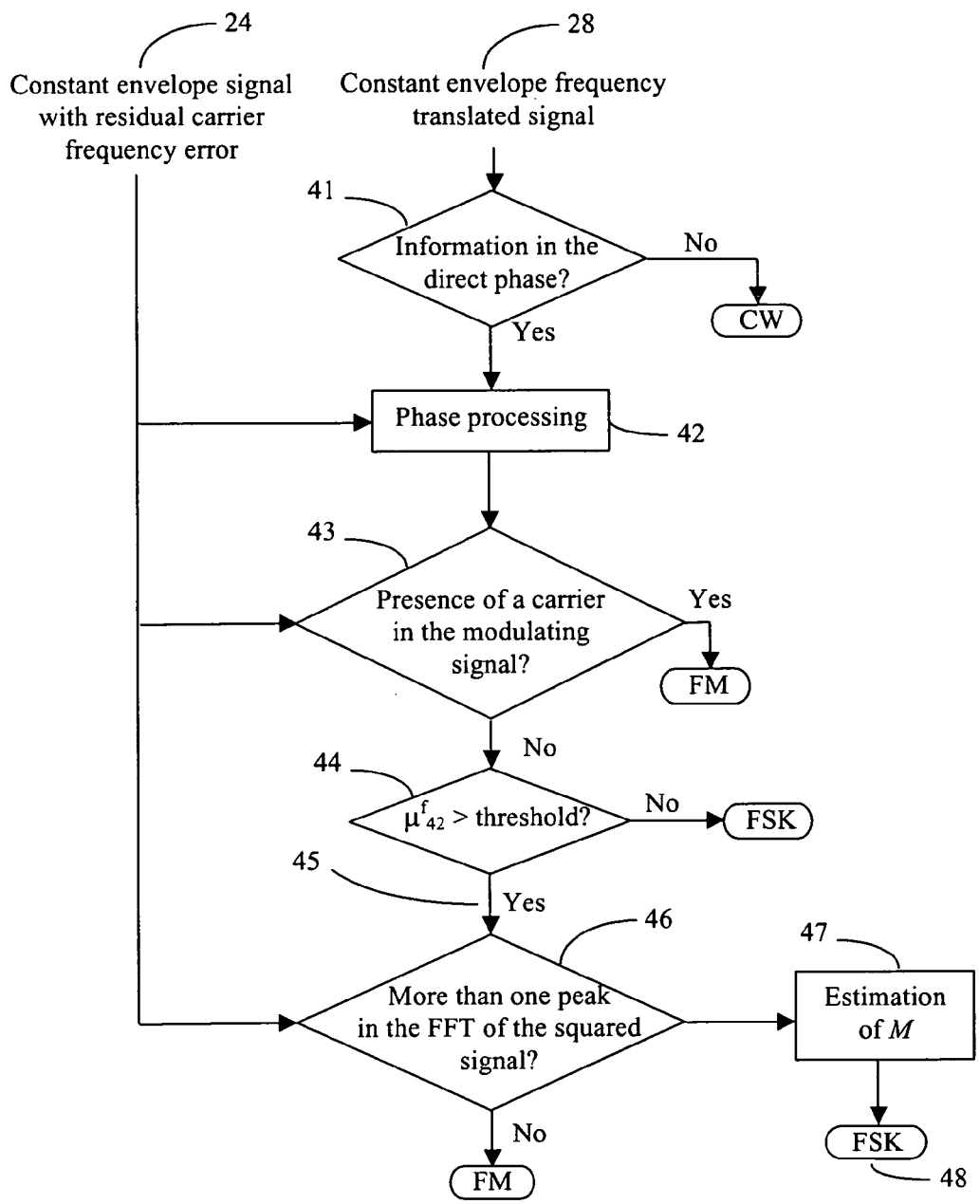
FIG. 6 is a flowchart illustrating the signal processing functions in the classifier block 30 of FIG. 2 for classifying the modulation of constant envelope signals.

The output 28 of FIG. 5 (and FIG. 2) is a frequency-translated, constant envelope signal. This signal is now forwarded to classifier 30 of FIG. 2 where its embedded modulation is further examined to determine if it is CW, FM or FSK. This classification process is illustrated in FIG. 6 and consists of two steps: (a) a test for significant phase variation to determine if the signal is CW or frequency modulated (41), and (b) a series of tests for determining specific frequency characteristics to enable discrimination between FM and FSK formats (42, 43, 44, and 46). The process begins at decision step 41 where the frequency-translated, constant envelope signal 28 is examined to determine if significant phase variations are present within its envelope. Since CW signals have a near-zero variance in the unwrapped phase (direct phase) and frequency-modulated signals have relatively high variances, a test that determines the variability of the unwrapped phase is used. However, this unwrapped phase test requires care when the signal vector amplitude is small because phase variations increase as the SNR decreases. The difficulty of this problem is mitigated by discarding any data sample whose amplitude is below a threshold. Such threshold lowers the probability of residual phase variance in the CW signal, while not affecting the phase variance of frequency-modulated signals. An amplitude threshold equal to the mean of the amplitudes of the sampled signal is chosen under the preferred embodiment of this invention. Discrimination between CW and frequency modulated signals is obtained by first retaining the samples of the signal 28 at an amplitude above the amplitude threshold, and then comparing the value of the unwrapped phase of these samples to a phase threshold whose value is generally optimized through computer simulation experiments. If little or no phase variation exists, decision test 41 determines that the signal is CW and notifies the phase processor 42 not to proceed with further classification. Conversely, if significant phase variations occur in the signal, step 41 declares the presence of frequency modulation and notifies the phase processor 42 to proceed with the next stage of classification process for discrimination between FM or FSK formats.

To perform the classification between FM and FSK formats, the frequency-uncorrected, constant envelope signal 24 is used instead of the frequency-translated signal 28 because the process for computing the latter signal (described in FIG. 5) may create large frequency errors for non-CW signals, and such large errors would create problems in determining the FM and FSK classifications. On the other hand, the residual carrier frequency error inherent in signal 24 is sufficiently small to allow for accurate discrimination between FM and FSK signals. In order to perform such discrimination between FM and FSK, the kurtosis coefficient of the instantaneous frequency content of the signal is used. This coefficient represents a measure of the flatness of the signal frequency distribution, and its value for analog FM is usually different from that of digital frequency modulated signals. The kurtosis coefficient also has a good behaviour at low SNRs. The coefficient is given by:

$$\mu_{42}^r = \frac{E[f_i^4(t)]}{(E[f_i^2(t)])^2}$$

where $f_i(t)$ is the instantaneous frequency (about the mean) at time t, and E[f(t)] is the time average of f(t) computed over the length of the observed signal.

The process begins at the phase processor 42 where the instantaneous frequency is obtained by computing the phase derivative of the constant envelope signal 24. This computation is further illustrated in FIG. 7, consisting of signal processing steps 49, 50, 51, 52, and 53. The phase of the constant envelope signal 24 is computed in step 49 to produce the instantaneous phase signal 50. The instantaneous phase signal is then processed through a low-pass filter (51 and 52) in order to limit the noise enhancement effects of the derivative function in step 53. A simple computation in BW estimation 51 roughly estimates the effective bandwidth of the phase signal which, in turn, selects from a library one of a small number of low-pass filters that has a cut-off frequency slightly higher than the signal bandwidth. The output of the derivative function 53 is the estimate of the instantaneous frequency 54. This estimated value is required in the computation of the kurtosis coefficient in step 44 of FIG. 6. It is also required to detect the possible presence of a low-modulated commercial FM signal in decision step 43. The FM modulation of such a signal contains the presence of silent periods, and, when demodulated, it produces a single discrete tone. Other forms of FM signals also contain such tones, such as the analog AMPS signals. Thus, the test performed on the constant envelope signal 24 in step 43 serves the purpose of detecting the presence of such a tone. If the tone is present, the signal is declared to be FM (commercial or AMPS). Conversely, if such tone is not present, the signal is either narrowband FM or FSK. Following this process, the kurtosis coefficient is tested. FM signals usually produce a kurtosis coefficient that is larger than 2.5. Conversely, the coefficient produced by FSK signals is smaller because such signals are more compactly distributed. Thus, if the kurtosis coefficient is below the 2.5 threshold, a decision is made in favour of FSK. When the kurtosis coefficient is higher than the 2.5 threshold, an initial decision is made at 45 in favour of FM. However, a further classification test is required at this point because FSK signals with highly filtered data (such as GMSK signals) may also have a high kurtosis coefficient. A frequency-modulated signal whose digital modulation contains a symbol rate of $f_{sym}$ and a frequency deviation of a multiple of $f_{sym}/4$, produces discrete frequency lines in the power spectral density (FFT) of the squared signal. For example, MSK and GMSK signals have a frequency deviation of $2 \times F_{sym}/4 = f_{sym}/2$ and a modulation level M=2. The FFT of the square of either signal produces two discrete frequency lines. Accordingly, the discrimination process is further refined in decision test 46 where the FFT of the squared constant envelope signal 24 is computed. (This computation is the same as the one done in steps 33 and 34 of FIG. 5). Thus, if two or more discrete frequency lines are detected, the signal is classified as FSK at 48. Conversely, if decision test 46 produces less than two lines, the signal is classified as FM.

This concludes the detailed description for the classification tests performed on constant envelope signals.

Frequency Error Correction of Irregular Envelope Signals

Figure 8:
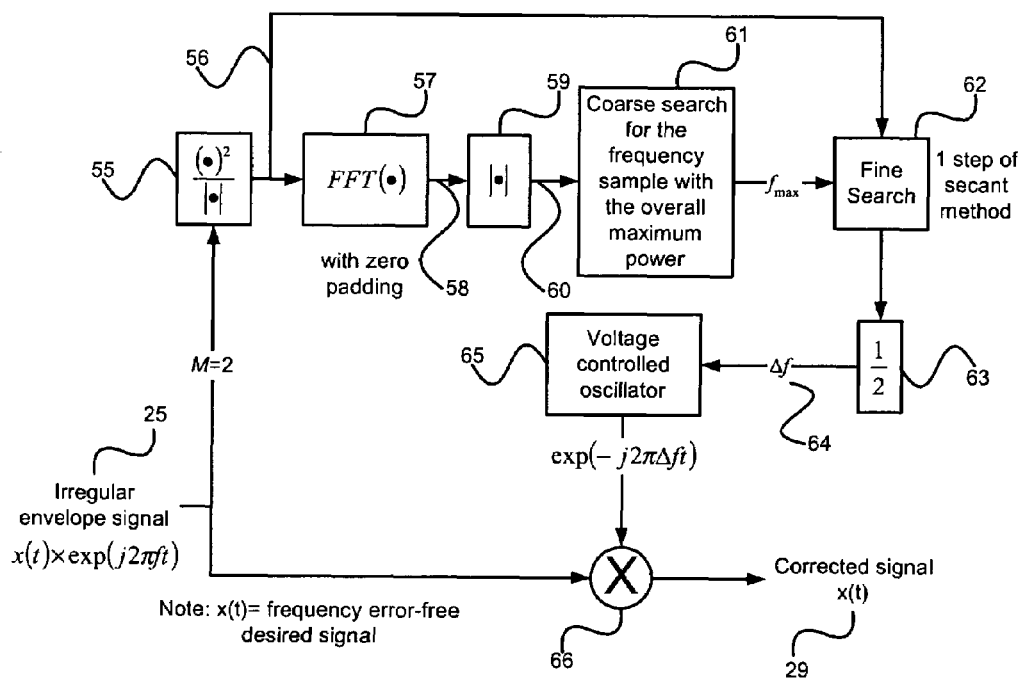
FIG. 8 is a block diagram illustrating the signal processing functions in the error correction block 27 of FIG. 2 for correcting the residual carrier frequency error inherent in some irregular envelope signals.
Figure 9:
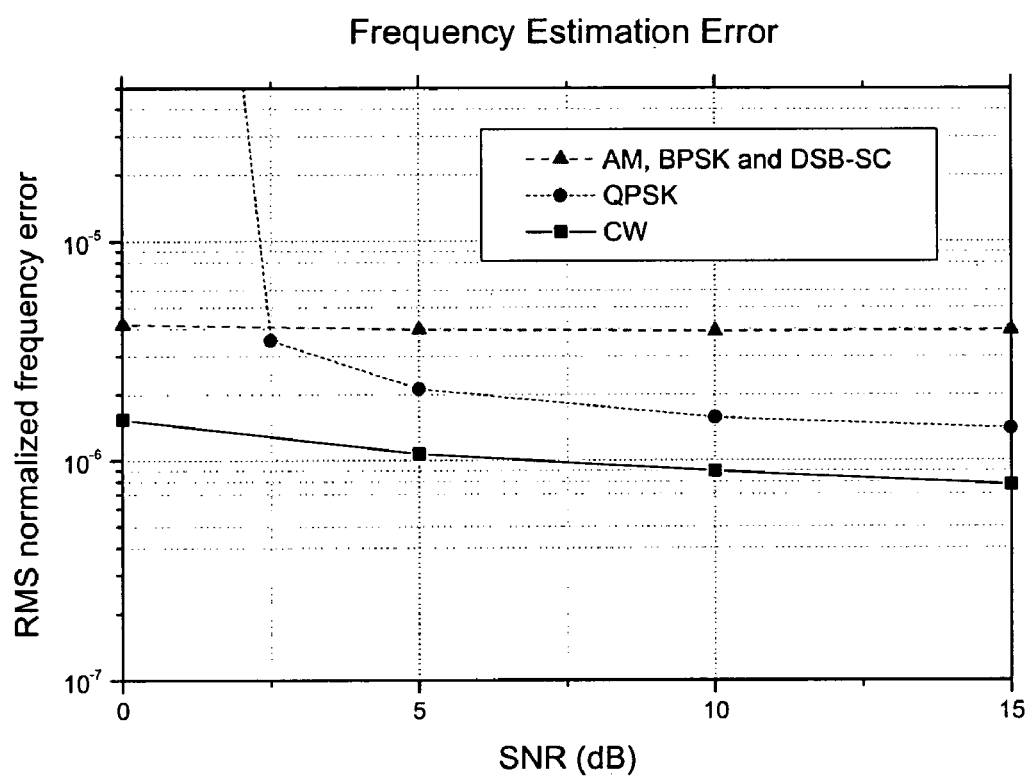
FIG. 9 is a graph illustrating the performance of the signal processing used in FIGS. 5 and 8 for correcting the residual carrier frequency error inherent in some selected signals.

The following steps describe the classification processes for signals that have irregular envelopes. When decision step 23 of FIG. 2 determines that the measured signal has an irregular envelope, the process moves to the error-correction processor 27 where the residual carrier frequency errors are estimated and corrected. This operation is performed in the frequency domain as illustrated in FIG. 8, and is similar to the operation described in FIG. 5. Again, the process consists of three signal processing steps: a coarse estimation of the carrier frequency (55, 57, 59, and 61); a refined estimation of the carrier frequency (62); and the carrier frequency error correction of the irregular envelope signal 25 (65 and 66). The process begins at step 55 where the square of the irregular envelope signal 25 is performed. The resulting signal is then processed by the FFT 57 with zero padding, squared in step 59, and forwarded to a coarse frequency estimator 61 where a search is done to locate the frequency line with maximum power. Zero padding and the squaring of the FFT output 58 perform the same resolution functions as those described in FIG. 5. Depending on the modulation format of the unknown signal, a peak in the frequency will appear in path 60. Choosing the frequency line with the highest peak, the process moves to a fine frequency estimator 62, where the carrier frequency estimation is further refined. This signal processor (62) also receives the normalized squared version 56 of the irregular envelope signal 25 and, using the one-step of the secant method as described in equation 3, computes the estimated carrier frequency error. This value is halved in step 63 according to the squaring non-linearity in step 55. The result Δf at 64 is used to set the frequency of a digital VCO 65 whose output $\{\exp(-j2\pi\Delta ft)\}$ is then multiplied by the irregular envelope signal 25 in a multiplier 66 to cancel out the signal's residual carrier frequency error. As illustrated in FIG. 9, the foregoing frequency error correction process is capable of obtaining a normalized RMS frequency estimation error lower than $10^{-5}$ for the SNRs of interest (ie., larger than 5 dB). This carrier recovery method is therefore sufficiently precise to avoid performance degradation due to the limitations described in FIG. 4. However, it should be noted that the frequency error estimation scheme performed in FIG. 8 does not produce an adequate estimation of the carrier frequency for MPSK signals. This limitation notwithstanding, the following-on process leading to the classification of MPSK uses the irregular envelope signal with residual carrier frequency errors at 25 of FIG. 2.

Classification of Irregular Envelope Signals

Figure 10:
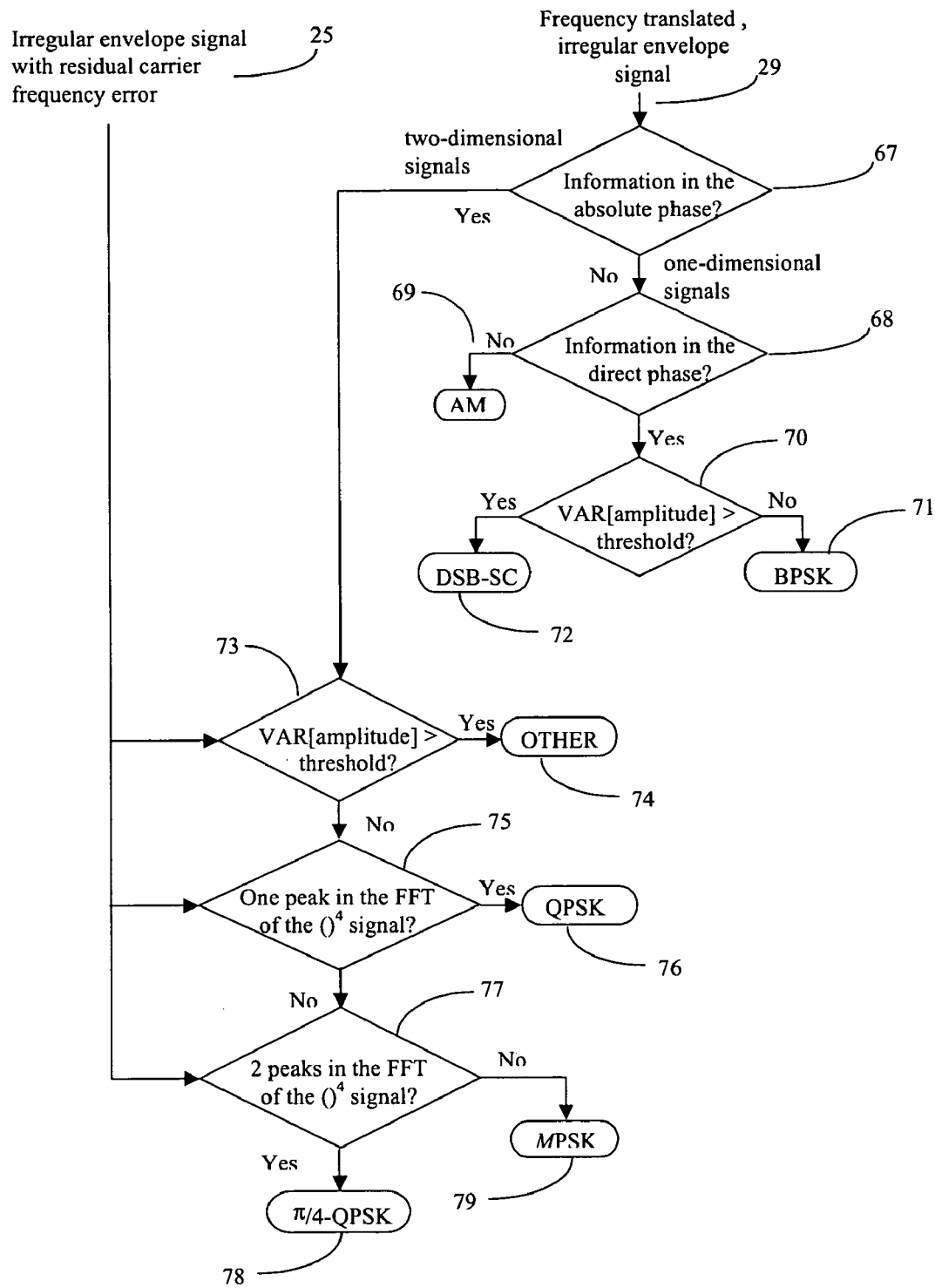
FIG. 10 is a flowchart illustrating the signal processing functions used for classifying the modulation of irregular envelope signals in the classifier block 31 of FIG. 2.

The frequency-translated, irregular envelope signal 29 of FIG. 8 (and FIG. 2) is now forwarded to classifier 31 of FIG. 2 where it is further examined to determine if it is amongst the set {AM, DSB-SC, BPSK, QPSK, MPSK, OTHER}. This classification process is illustrated in FIG. 10 and comprises the following signal processing steps: discrimination between one-dimensional and two-dimensional signals (67); classification of one-dimensional signals (68 and 70); and classification of two-dimensional signals (73, 75, and 77). The process begins at decision test 67 where the frequency-translated, irregular envelope signal 29 is examined to determine if any modulation information is carried in the phase of the signal. If such information is not present, the signal modulation corresponds to the actual baseband, such as AM (transmitted carrier), DSB-SC, or BPSK, and is recognized as one-dimensional. These signals are recognized from their absolute centred unwrapped phase sequence which has a small variance. In practice, the process requires phase unwrapping because the initial carrier phase is random. However, phase unwrapping is very sensitive to noise, particularly on DSB-SC and BPSK signals due to their 180° phase transitions. Moreover, any phase unwrapping error will seriously increase the variance of the absolute centred phase. To avoid phase unwrapping of DSB-SC and BPSK signals, a new quantity is introduced in step 67 called the "absolute" phase, and is defined as $$\phi_a(t) = \angle(|I(t)| + j|Q(t)|)$$

where I(t) and Q(t) are the inphase and quadrature samples at time t. By taking the absolute values of the real and imaginary parts of a signal, a phase sequence between 0 and π/2 radians is produced. The phase sequence allows for a significant reduction in the size of the observation space required to make a decision. For DSB-SC signals the variance of the phase of the resulting signal is generally small. Small variance is also true for BPSK and AM signals. For two-dimensional signals bearing some phase information (such as QPSK and MPSK signals), the variance of the absolute phase is high, tending towards the variance of a uniformly distributed random variable in the interval [0, π/2] radians. To provide a better separation between one and two-dimensional baseband signals, a threshold on the amplitude of the signal is used in step 67, and the samples below this threshold are discarded. The use of the amplitude threshold reduces the variance of the phase on one-dimensional signals, without significantly affecting the variance on two-dimensional signals. Simulations show that the best results occur when the said threshold is set equal to the mean of the amplitude of the phase sequence. If decision step 67 determines that the signal modulation is one-dimensional, the process moves to decision test 68 where the variance of the unwrapped phase (direct phase) is computed. Due to the presence of π radian jumps in the instantaneous phase of DSB-SC and BPSK signals, the said variance is much higher for these signals than for AM signals. Phase unwrapping is useful in this case because errors of this quantity are unlikely for AM signals, thus providing a good discriminating feature. In order to reduce the phase variance for AM signals, a threshold equal to the mean amplitude is set on the amplitude of the signal samples in step 68. An indication of low phase variance thus classifies the signal as AM at 69. Note also that ASK modulation is a digital form of amplitude modulation. ASK signals are therefore classified as AM signals at 69. If the phase variance is high, decision step 68 determines that the signal is not AM and moves to decision step 70 where a further test is made to determine if the signal is BPSK or DSB-SC. Unlike BPSK signals, DSB-SC signals bear an envelope for which the amplitude varies substantially over time. Accordingly, step 70 computes the variance of the envelope and uses it to discriminate between a DSB-SC signal at 72 and a BPSK signal at 71.

Returning to step 67, if the test determines that the signal is two-dimensional, the process moves to decision steps 73, 75 and 77 where PSK signals are separated from QAM and other unidentified modulation types. To perform the classification between QPSK, π/4-QPSK, MPSK and OTHER types of two-dimensional formats, the frequency-uncorrected, constant envelope signal 25 from decision step 23 is used instead of the frequency-translated signal 29 computed in FIG. 8, because the residual carrier frequency error inherent in signal 25 is sufficiently small to allow for accurate discrimination between the QPSK, π/4-QPSK, MPSK and OTHER signals. To initiate this classification in decision step 73, a simple test on the variance of the signal amplitude is performed. If the variance of the amplitude is below a given threshold, the signal is assumed to be a PSK signal. Even though band-limited PSK signals do exhibit amplitude variations, such variations are much less noticeable than those for QAM, SSB or VSB signals. This test is therefore sufficient to discriminate PSK signals from most of the other two-dimensional signals as OTHER at 74. If the test determines that the signal is PSK, the process moves to decision step 75 where the signal is further examined to determine if its embedded modulation is QPSK, π/4-QPSK or MPSK. This test is performed by computing the fourth power of the signal 25. QPSK signals produce a single peak in the power spectral density of the resulting signal, while π/4-QPSK signals produce two peaks separated in frequency by twice the baud rate. Therefore, if the test in step 75 results in one peak, the signal is classified as QPSK at 76. Otherwise the process moves to decision test 77 where the combination of two peaks classifies the modulation as π/4-QPSK at 78 and the absence of any peak classifies the modulation as MPSK at 79.

This concludes the detailed description for the classification tests of irregular envelope signals. The description covering the overall decision tree process as illustrated in FIG. 11, is given below.

Overall Description of the Preferred Embodiment

Figure 11:
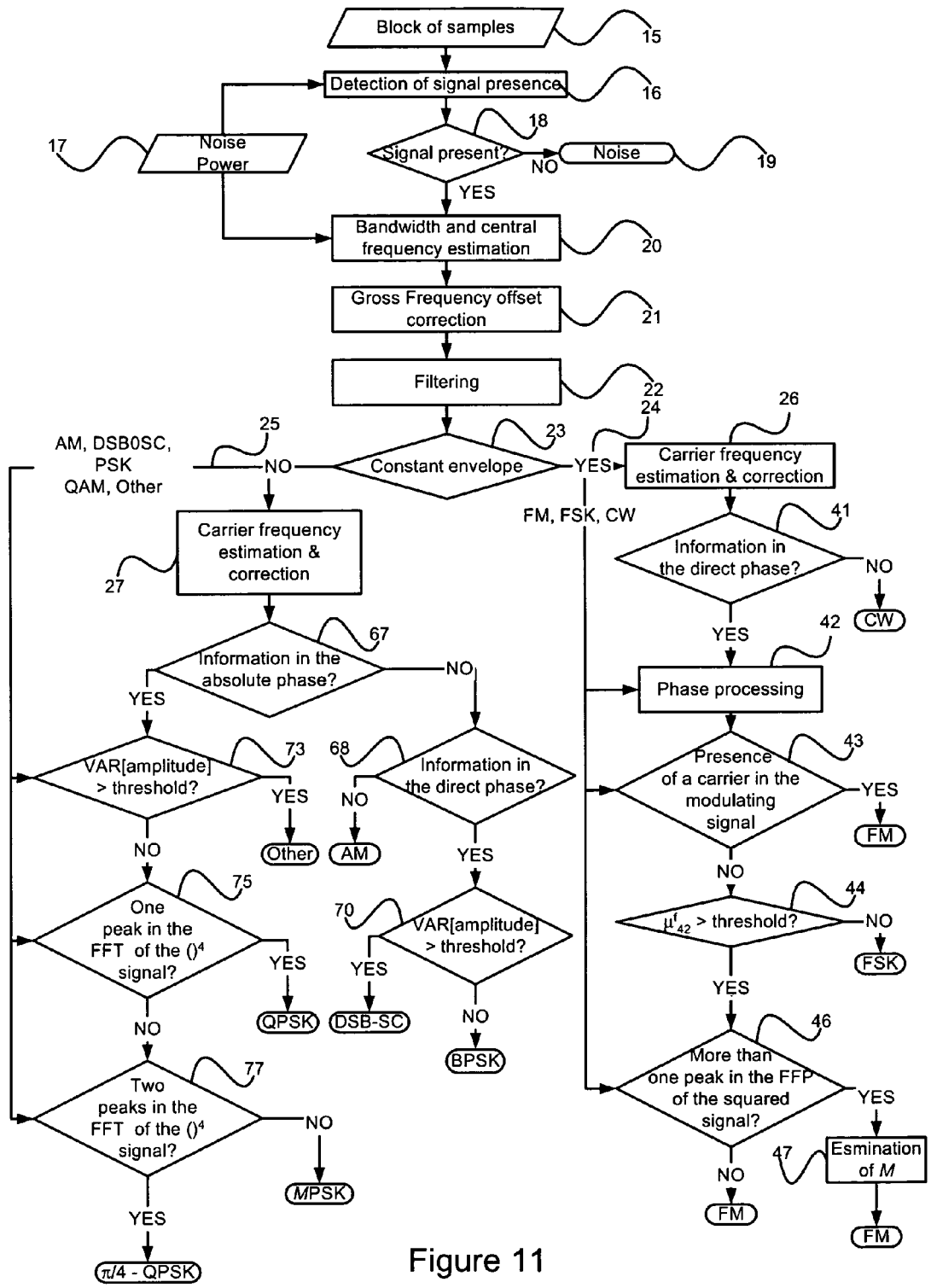
FIG. 11 is a summary flowchart depicting the entire modulation classification process of the present invention, which entails the combination of FIGS. 2, 6 and 10.

FIG. 11 illustrates a complete overview of the modulation classification section 3 of FIG. 1 and collects together the signal processing functions illustrated in FIGS. 2, 6 and 10. The process begins at input 15 where a block of digital complex samples is obtained from the output 8 of the Receiver Section of FIG. 1. These samples are forwarded to a signal detector 16 where Fast Fourier processing determines if sufficient signal power is available to establish the presence of a signal. This process is performed with the aid of an external noise power module 17 that establishes a power threshold against which the power spectral density of the observed signal is compared. The noise power module 17 is also used in step 20 to set another threshold for computing the centroid frequency and estimating the signal bandwidth of the signal. If the signal energy is not above a noise-related threshold, the SNR is considered too small to allow further processing and the signal is classified as NOISE in step 19. However, if a signal is declared present, then the gross estimate of the carrier frequency inherent in the signal is determined in step 20. This operation is done by computing the centroid of the portion of the power spectral density that is above a certain threshold. Frequency translation of the signal is then performed in correction step 21 where the carrier frequency is corrected by an amount equal to the centroid frequency. The frequency bandwidth is also estimated in estimation step 20. This estimated bandwidth is then used in filter step 22 to filter the out-of-band noise power from the frequency-translated signal in estimation step 20. The process for detecting and classifying the modulation format embedded in the signal starts in decision test 23 where discrimination between constant envelope signals and irregular envelope signals is performed. When decision test 23 determines that the signal has a constant envelope, the process moves to the error-correction step 26 where the residual carrier frequency error is estimated and corrected. The classification of constant-envelope signals starts in decision test 41 and consists of the following steps: (a) a test for significant phase variation to determine if the signal is CW or frequency modulated (41), and (b) a series of tests for determining specific frequency characteristics to enable discrimination between FM and FSK formats (42, 43, 44 and 46). If little or no phase variation exists in the frequency-translated signal, decision test 41 determines that the signal is CW and notifies the phase processor 42 not to proceed with further classification. Conversely, if significant phase variations occur in the signal, decision test 41 declares the presence of frequency modulation and notifies the phase processor 42 to proceed with the next stage of classification process for discrimination between FM or FSK formats. To perform the classification between FM and FSK formats, the frequency-uncorrected, constant-envelope signal 24 from decision step 23 is used. The process begins at computing step 42 where the instantaneous frequency is obtained by computing the phase derivative of the constant envelope signal 24. This estimated value is required in the computation of the kurtosis coefficient in decision test 44. It is also required to detect the possible presence of a low-modulated commercial FM signal in decision test 43. The FM modulation of such a signal contains the presence of silent periods, and, when demodulated, it produces a single discrete tone. Other forms of FM signals also contain such tones, such as the analog AMPS signals. Thus, the test performed on the constant envelope signal 24 in decision test 43 serves the purpose of detecting the presence of such a tone. If the tone is present, the signal is declared to be FM (commercial or AMPS). Conversely, if such tone is not present, the signal is either narrowband FM or FSK. Following this process, the kurtosis coefficient is tested in decision test 44. FM signals usually produce a kurtosis coefficient that is larger than 2.5. Conversely, the coefficient produced by FSK signals is smaller because such signals are more compactly distributed. Thus, if the kurtosis coefficient is below the 2.5 threshold, a decision is made in favour of FSK. When the kurtosis coefficient is higher than the 2.5 threshold, an initial decision is made in favour of FM. However, a further classification test is required at this point because FSK signals with highly filtered data (such as GMSK signals) may also have a high kurtosis coefficient. The discrimination process is further refined in decision step 46 where the FFT of the squared constant envelope signal 24 is computed. If two or more discrete frequency lines are detected, the signal is classified as FSK. The estimate of the number of symbols M is obtained in counting step 47 by counting the number of FFT peaks. Conversely, if decision test 46 produces less than two lines, the signal is classified as FM.

When decision step 23 determines that the measured signal has an irregular envelope, the process moves to the error-correction step 27 where the residual carrier frequency errors are estimated and corrected. The frequency-translated, irregular envelope signal output of error correction step 27 is now forwarded to decision test 67 where it is further examined to determine if it is amongst the set {AM, DSB-SC, BPSK, QPSK, MPSK, OTHER}. This classification process comprises of the following signal processing steps: discrimination between one-dimensional and two-dimensional signals (67); classification of one-dimensional signals (68 and 70); and classification of two-dimensional signals (73, 75, and 77). The process begins at decision test 67 where the frequency-translated, irregular envelope signal is examined to determine if any modulation information is carried in the phase of the signal. If such information is not present, the signal modulation corresponds to the actual baseband, such as AM (transmitted carrier), DSB-SC, or BPSK, and is recognized as one-dimensional. If decision test 67 determines that the signal modulation is one-dimensional, the process moves to decision test 68 where the variance of the unwrapped phase (direct phase) is computed. An indication of low phase variance thus classifies the signal as AM. If the phase variance is high, decision test 68 determines that the signal is not AM and moves to decision step 70 where a further test is made to determine if the signal is BPSK or DSB-SC. Unlike BPSK signals, DSB-SC signals bear an envelope for which the amplitude varies substantially over time. Accordingly, decision test 70 computes the variance of the envelope and uses it to discriminate between a DSB-SC signal from a BPSK signal.

Returning to decision step 67, if the test determines that the signal is two-dimensional, the process moves to decision steps 73, 75 and 77 where PSK signals are separated from QAM and other unidentified modulation types. To perform the classification between QPSK, $\pi/4$-QPSK, MPSK and OTHER types of two-dimensional formats, the frequency-uncorrected, constant envelope signal 25 from decision test 23 is used. To initiate this classification in decision step 73, a simple test on the variance of the signal amplitude is performed. If the variance of the amplitude is below a given threshold, the signal is assumed to be a PSK signal. Otherwise, it is classified as OTHER. If the test determines that the signal is PSK, the process moves to decision step 75 where the signal is further examined to determine if its embedded modulation is QPSK, $\pi/4$-QPSK or MPSK. This test is performed by computing the fourth power of the signal 25. QPSK signals produce a single peak in the power spectral density of the resulting signal, while $\pi/4$-QPSK signals produce two peaks separated in frequency by twice the baud rate. Therefore, if the test in step 75 results in one peak, the signal is classified as QPSK, otherwise the process moves to decision step 77 where the combination of two peaks classifies the modulation as $\pi/4$-QPSK and the absence of any peak classifies the modulation as MPSK.

Different aspects of the embodiment in FIG. 1 are possible. For example, the signal coming to the Receiver Section 2 can be measured from a tapped wireline, or from another receiver or pre-amplification section. The signal may also have been amplified and filtered by an alternate receiver, and be introduced before the frequency down conversion 5. Similarly, the down conversion to complex baseband could be performed on an alternate set of hardware, and the signal could be introduced before the sampling function 6. Furthermore, the sampled digital complex baseband signal 8 could be obtained from a receiver section with a different configuration, or it could be retrieved from a digital memory location where it had been previously stored. Note that, for practical reasons, the sampling function 6 and the A/D converter 7 are usually implemented in a single unit, and that it is not very likely that the signal could be introduced before the digital conversion function 7. Such a procedure is nevertheless conceptually also possible.

PERFORMANCE EVALUATION

In order to demonstrate the methods described in the present invention, 500 simulated signals of each of the modulation types have been generated and processed. These signals covered a wide variety of parameters as described in the next section. A sampling frequency of 48 kHz was used covering a bandwidth slightly larger than the occupied bandwidth of most narrowband communications signals. Sequences of 85.3 msec (representing 4096 samples) were used as inputs to the modulation classifier (block 3 of FIG. 1). Complex baseband signals were used, whereas the carrier frequency and phase errors were simulated. The frequency error was random and uniformly distributed over a range [−4.8 kHz to 4.8 kHz], while the initial carrier phase was uniformly distributed over [−$\pi$ to $\pi$]. For digitally modulated signals, a random delay uniformly distributed over [0 to Ts] was used to simulate symbol timing uncertainties (where $T_s$ is the sampling interval equal to 1/48000 seconds).

Simulation of Specific Signals
Analog Modulations

For analog modulation schemes, two types of source signals were simulated. The first was a real voice signal, band-limited to [0 to 4 kHz]. The second was a simulated voice signal that used a first-order autoregressive process of the form:

$$y[k]=0.95 \times y[k-1]+n[k]$$

where n[k] is a white Gaussian noise process. Furthermore, this pseudo-voice signal was band-limited from 300 to 4000 Hz.

For AM signals, a constant value was added to the source signal. The modulation index was calculated by using the maximum amplitude value over the whole source signal. The index was then uniformly distributed in the interval [50% to 100%]. The total length of the real source signal was about 120 seconds, while that for the pseudo-voice was about 40 seconds. From these two source signals, sequences of 85.3 msec in duration were randomly extracted. Thus, the observed modulation index for a sequence was equal to or less than the chosen modulation index. For frequency-modulated signals, a cumulative sum was used to approximate the integral of the signal source. Generic FM signals were simulated using real or pseudo-voice signals with a modulation index uniformly distributed in the interval [1 to 4]. The bandwidth occupied by these signals ranged from 16 kHz to 40 kHz, using the approximation:

$$BW \approx 2(\beta+1)f_{max}$$

where $\beta$ is the modulation index and $f_{max}$ is the maximum source frequency (4 kHz in this case). The AMPS FM signals were approximated using a modulation index of 3.

Digital Modulations

Continuous-phase FSK signals were simulated by using filtered M-ary symbols to provide frequency modulation to a carrier frequency. Pager signal parameters were based on observations of real signals, with 2FSK modulation at a bit-rate of 2400 bps, a frequency deviation of 4.8 kHz, and almost no filtering. 4FSK signals were also simulated, using the same 4.8 kHz frequency deviation and a symbol rate of 1200 baud. The 19.2 kbps, 2FSK signals from the Racal Jaguar radio were simulated, using a frequency deviation of 6.5 kHz and a 5$^{th}$ order Butterworth pre-modulation filter with a cutoff frequency of 9.6 kHz. Also included in the simulation were GMSK signals that were similar to GSM signals having a BT product of 0.3.

For PSK and QAM signals, the symbols were filtered with either a raised cosine function or a square root raised cosine function. The selection was randomly performed with equal probabilities. The rolloff factors of 20%, 25%, 30%, 35%, 40%, 45%, and 50% were uniformly and randomly selected. For all these signals, the symbol rates were chosen randomly between 16 and 20 kbaud. Also simulated were π/4-QPSK signals that were similar to IS-54 signals, with a symbol rate of 24 kbaud and a square-root raised cosine pulse-shaping filter with a rolloff factor of 35%.

Additive Noise

The simulated signals were passed through an additive white Gaussian noise channel before being classified. For the simulation, no filtering was done at the receiver, therefore the signal observed by the modulation classifier was corrupted by the white noise. The noise power was calculated from the knowledge of the average power of the modulated signal and the SNR over the sampling bandwidth. This SNR was defined as:

$$SNR_{samp} = S/(N_o F_s)$$

where S is the signal power, $N_o$ is the white noise power spectral density, and $F_s$ is the sampling frequency equal to 48 kHz.

For amplitude-modulated signals [AM, DSB-SC, and SSB], the amplitude power was calculated by using all source signals (real and pseudo-voice). This condition implies that, for a given sequence, the observed SNR might be different from the overall SNR, which is especially true for DSB-SC and SSB signals where some segments of the signals, because of silence segments, may have no power at all.

Binary Decision Thresholds

With respect to the decision tree analyses performed under the present invention, each decision compares a signal feature with a threshold. For the simulations undertaken, the thresholds were set from the results of direct observations of the feature distributions in a training set of simulated signals having an SNR of 5 dB. These selected thresholds are summarized in Table 1 for the different features.

TABLE 1

Decision thresholds used in the simulations.

| Feature | Threshold |
|---|---|
| Power level above noise level, for detection of signal presence (Step 16) | 10 dB |
| Power level above noise level, for bandwidth and centroid estimation (Step 20) | 5 dB |
| Maximum of the normalized squared FFT of the centered normalized envelope ($\square_{max}$) (Step 23) | 1.44 |
| Variance of the direct phase (rad) (CW vs. FM/FSK in Step 41) | 0.25 |
| Variance of the direct phase (rad) (AM vs. DSB-SC/BPSK in Step 68) | 4.0 |
| Variance of the "absolute" phase (rad)(one-dimensional vs two-dimensional signals in Step 67) | 0.144 |
| Kurtosis of the instantaneous frequency (FM vs FSK in Step 44) | 2.5 |
| Variance of the normalized amplitude in one-dimensional signals (DSB-SC vs BPSK in Step 70) | 0.25 |
| Variance of the normalized amplitude in MPSK signals (OTHER vs QPSK/π/4-QPSK/MFSK in Step 73) | 0.15 |

Classification Results

An estimate of the performance of the modulation classification method of the present invention was obtained by applying the simulated signals described earlier. For each modulation type, the 500 generated sequences were classified by using the preferred decision tree methods illustrated in FIG. 11. Eleven outputs from the modulation classifier were possible: NOISE, CW, AM, DSB-SC, FM, FSK, BPSK, QPSK, π/4-QPSK, MPSK, and OTHER. Table 2 shows the classification results for each of the simulated modulation types at a SNR of 5 dB. The results of this table were obtained in the presence of uniformly distributed frequency errors between −4.8 kHz and 4.8 kHz (10% of the sampling frequency). The initial carrier phase was also uniformly distributed over the range of −π to π. For digitally-modulated signals, a random delay uniformly distributed over one sample period, was used to simulate symbol timing uncertainties.

TABLE 2

Classification results (in %) for a SNR of 5 dB.

| | NOISE | CW | AM | DSB-SC | FM | FSK | BPSK | QPSK | π/4-QPSK | MPSK | OTHER |
|---|---|---|---|---|---|---|---|---|---|---|---|
| CW | | 99.8 | 0.2 | | | | | | | | |
| AM (V) | | | 62.6 | 37.4 | | | | | | | |
| AM (SV) | | | 14.4 | 85.6 | | | | | | | |
| DSB-SC (V) | 34.4 | | | 53.8 | | | | | | | 11.8 |
| DSB-SC (SV) | | | | 100.0 | | | | | | | |
| FM (V) | | 17.6 | 0.6 | | 69.0 | 12.0 | | 0.2 | | 0.6 | |
| FM (SV) | | | | | 98.4 | | | | | 1.6 | |
| AMPS | | | | | 98.6 | | | | | 1.4 | |
| Pager | | | | | | 98.4 | 0.4 | | 1.2 | | |
| FSK4 | | | | | | 98.2 | | 0.2 | 0.2 | 1.4 | |
| Jaguar | | | | | | 98.0 | | | | 2.0 | |
| GMSK | | | | | | 99.8 | | | 0.2 | | |
| BPSK | | | | | | | 100.0 | | | | |
| QPSK | | | | | | | 2.6 | 97.0 | | | 0.4 |
| π/4-QPSK | | | | | | | | 0.6 | 99.4 | | |

TABLE 2-continued

Classification results (in %) for a SNR of 5 dB.

| | NOISE | CW | AM | DSB-SC | FM | FSK | BPSK | QPSK | π/4-QPSK | MPSK | OTHER |
|---|---|---|---|---|---|---|---|---|---|---|---|
| PSK8 | | | | | | 3.8 | | | | 96.2 | |
| PSK16 | | | | | | 5.6 | | | | 94.2 | 0.2 |
| QAM16 | | | | | | | | | | | 100.0 |
| QAM64 | | | | | | | | | | | 100.0 |
| SSB (V) | 29.6 | | 6.0 | 9.6 | | | 1.6 | 0.6 | | | 52.6 |
| SSB (SV) | | | | | | | | | | | 100.0 |

In Table 2, it is important to note the difference between the classification for analog modulation signals using real voice (denoted by "V") and those using simulated voice (denoted by "SV"). For these modulations, the real voice signals included pause and silent durations, whereas the simulated voice signals were generated continuously, without any silent duration. For analog modulation, the pauses in a real voice source produced unmodulated sequences. For DSB-SC and SSB modulated signals, such pauses produced no signal at all. In the case where the duration of the 85.3 msec sequence was mostly a pause, the signal was classified as noise or as OTHER. In the case where the transition between a pause and voice was not clear within the 85.3 msec observation, erroneous modulation types appeared (as the row for SSB(V) in table 2 indicates). For AM and FM signals, the absence of a source signal produced a CW classification. If the duration of the silence occupied most of the 85.3 msec observation time, such quiet sequences were classified as CW signals. Again, depending on the transition time between a pause and a voice, strange results appeared (as the row for FM(V) of Table 2 indicates). These results are not considered classification errors as such. Rather, they reflect the fact that the classification is more difficult to perform for analog-modulated signals when using a very short observation time. Such perceived errors would be eliminated by either increasing the length of the observation time before the classification is undertaken, or adding a post-processing step that accumulates the results of several observations and performs a decision according to the dominant modulation type.

Modular Construction

The modular nature of the classification process illustrated in FIG. 11 allows for different modulation schemes to be classified. Furthermore, although the disclosed approach under the present invention assumes an AWGN channel, there are possibilities of extending the channel to more complex models by employing additional processing, such as the method of blind equalization.

Changes and modifications in the specifically described embodiments can be carried out without departing from the scope of the invention which is intended to be limited only by the scope of the appended claims.

What is claimed is:

1. A method for recognizing the type of modulation of a complex baseband signal extracted from a modulated signal having a carrier frequency, said method comprising the steps of:
   (a) generating a pre-processed signal from the baseband signal;
   (b) examining amplitude variations in the pre-processed signal to identify the type of envelope thereof as being one of a constant envelope and an irregular envelope;
   (c) estimating the carrier frequency error in the pre-processed signal;
   (d) correcting the pre-processed signal for the carrier frequency errors to generate a carrier-corrected signal; and
   (e) classifying the type of modulation in the carrier-corrected signal, based on the type of envelope identified in the examining step.

2. The method of claim 1, wherein the generating step includes a step of detecting presence of the baseband signal by estimating the power spectral density thereof with the aid of externally measured background noise power, and comparing said power spectral density against a power threshold derived from the background noise and a predefined probability of detection.

3. The method of claim 2, wherein the generating step further includes, after the detecting step, a process of gross error correction of the carrier frequency.

4. The method of claim 3, wherein the gross error correction process includes the steps of:
   (a) estimating baseband frequency bandwidth by comparing the power spectral density against a bandwidth threshold derived from the background noise and a predefined bandwidth estimation error and a predefined probability of detection;
   (b) estimating main centroid frequency of the baseband signal, by determining a component centroid frequency of at least one frequency component in the power spectral density bearing a power above the bandwidth threshold; and
   (c) frequency translating the baseband signal by the main centroid frequency, followed by low-pass filtering with a filter bandwidth derived from the baseband frequency bandwidth.

5. The method of claim 1, wherein when the type of envelope is identified as a constant envelope, the classifying step classifies the type of modulation according to the phase and frequency contents of the pre-processed and carrier-corrected signals.

6. The method of claim 1, wherein when the type of envelope is identifies as an irregular envelope, the classifying step classifies the type of modulation according to the phase and amplitude contents of the carrier-corrected signal.

7. The method of claim 1, wherein when the type of envelope is identified as a constant envelope, the step of estimating the carrier frequency error includes the steps of:
   (a) obtaining the normalized squared amplitude of the carrier-corrected signal and applying thereto a Fast Fourier Transform (FFT) with zero-padding to generate an FFT output;
   (b) squaring the absolute values of the FFT output to generate a frequency spectrum;

(c) searching the frequency spectrum to find a maximum-power frequency sample; and (d) performing a fine search for the carrier frequency error, by applying one step of a secant optimization process to the maximum-power frequency sample and the pre-processed signal.

8. The method of claim 1, wherein when the type of envelope is identified as an irregular envelope, the step of estimating the carrier frequency error includes the steps of:

(a) obtaining the normalized squared amplitude of the carrier-corrected signal and applying thereto a Fast Fourier Transform with zero-padding to generate an FFT output;

(b) obtaining the square of the absolute values of the FFT output to generate a frequency spectrum;

(c) searching the frequency spectrum to find a maximum-power frequency sample; and (d) performing a fine search for the carrier frequency error, by applying one step of a secant optimization process to the maximum-power frequency sample and the output of the normalized squared amplitude signal.

9. The method of claim 1, wherein when the type of envelope is identified as a constant envelope, the step of classifying the type of modulation includes the steps of:

(a) obtaining the direct phase variance for samples of the carrier-corrected signal above the mean amplitude of the carrier-corrected signal;

(b) comparing the direct phase variance to a predefined phase threshold; and (c) classifying the type of modulation as Continuous Wave when the direct phase variance is below the phase threshold, and as Frequency Modulation when the direct phase variance is above the phase threshold.

10. The method of claim 9, wherein when the type of modulation is classified as Frequency Modulation, the classifying step further includes the steps of obtaining the instantaneous frequency distribution of the pre-processed signal and obtaining the FFT of the said instantaneous frequency distribution, such that the type of modulation is classified as analog FM when the presence of a tone is detected in the FFT of the instantaneous frequency distribution.

11. The method of claim 10, wherein when no tone is detected in the FFT of the instantaneous frequency distribution, the classifying step further includes the steps of determining the kurtosis coefficient of the instantaneous frequency distribution, such that the type of modulation is classified as Frequency Shift Keying (FSK) when the kurtosis coefficient is below a predetermined coefficient threshold.

12. The method of claim 11, wherein when the kurtosis coefficient is above a predetermined threshold, the classifying step further includes obtaining the FFT of the squared value of the pre-processed signal and counting the number of peaks contained in said FFT, such that when the number of peaks is more than one, the type of modulation is classified as FSK, having a number of modulation levels equal to the number of peaks; and as analog FM otherwise.

13. The method of claim 12, wherein the step of obtaining the instantaneous frequency distribution includes the steps of:

(a) computing the instantaneous phase distribution of the pre-processed signal;

(b) estimating the bandwidth of the instantaneous phase distribution;

(c) low-pass filtering the instantaneous phase distribution to generate a filtered phase distribution; and (d) estimating time derivative of the filtered phase distribution.

14. The method of claim 1, wherein when the type of envelope is identified as an irregular envelope, the step of classifying the type of modulation includes a step of obtaining from the carrier-corrected signal the variance of the absolute phase $\phi_a(t)=\angle(|I(t)|+j|Q(t)|)$ for signal samples above the mean signal amplitude, such that the type of modulation is classified as being:

(a) one of Amplitude Modulation (AM), Double Sideband Suppressed Carrier (DSB-SC), and Binary Phase Shift Keying (BPSK), when the absolute phase variance is below a predefined phase threshold; and (b) one of Quarternary Phase Shift Keying (QPSK), $\pi/4$-QPSK, M-ary PSK, and OTHER, when the absolute phase variance is above said phase threshold.

15. The method of claim 14, wherein when the absolute phase variance is below the phase threshold, the classifying step further includes a step of obtaining from the carrier-corrected signal the direct phase variance for signal samples above the mean signal amplitude, such that the type of modulation is classified as being one of DSB-SC and BPSK when the direct phase variance is above the phase threshold, and as AM otherwise.

16. The method of claim 15, wherein when the direct phase variance is above the phase threshold, the classifying step further includes a step of determining the amplitude variance of the carrier-corrected signal, such that the type of modulation is classified as DSB-SC when the amplitude variance is above a predefined amplitude threshold, and as BPSK otherwise.

17. The method of claim 14, wherein when the absolute phase variance is above the phase threshold, the classifying step further includes a step of obtaining from the pre-processed signal the amplitude variance, such that the type of modulation is classified as OTHER when the amplitude variance is above a predefined amplitude threshold, and as PSK otherwise.

18. The method of claim 17, wherein when the amplitude variance is below the amplitude threshold, the classifying step further includes a step of applying a fourth power non-linearity to the pre-processed signal followed by computing Fast Fourier Transform to generate an FFT output; such that the type of modulation is classified as QPSK if the FFT output bears only one discrete component, as $\pi/4$-QPSK when the FFT output bears two discrete components, and as M-ary PSK with M larger than 4 otherwise.

19. A method for recognizing the type of modulation of a complex baseband signal extracted from a modulated signal having a carrier frequency, said method comprising the steps of:

(a) detecting presence of the baseband signal by estimating the power spectral density thereof with the aid of externally measured background noise power, and comparing said power spectral density against a power threshold derived from the background noise and a predefined probability of detection;

(b) estimating baseband frequency bandwidth by comparing the power spectral density against a bandwidth threshold derived from the background noise and a predefined bandwidth estimation error and a predefined probability of detection;

(c) estimating main centroid frequency of the baseband signal, by computing a component centroid frequency of at least one frequency component in the power spectral density bearing a power above the bandwidth threshold;

(d) performing gross carrier error correction by frequency translating the baseband signal by the main centroid frequency, followed by low-pass filtering with a filter bandwidth derived from the baseband frequency bandwidth, thereby generating a pre-processed signal from the baseband signal;

(e) examining amplitude variations in the pre-processed signal to identify the type of envelope thereof as being one of a constant envelope and one of an irregular envelope;

(f) estimating the carrier frequency error in the pre-processed signal by performing the steps of:
  (i) obtaining the normalized squared amplitude of the carrier-corrected signal and applying thereto a Fast Fourier Transform with zero-padding to generate an FFT output;
  (ii) squaring the absolute values of the FFT output to generate a frequency spectrum;
  (iii) searching the frequency spectrum to find a maximum-power frequency sample; and
  (iv) performing a fine search for the carrier frequency error, by applying one step of a secant optimization process to the maximum-power frequency sample and the pre-processed signal;

when the type of envelope is identified as a constant envelope; and by performing the steps of:
  (v) obtaining the normalized squared amplitude of the carrier-corrected signal and applying thereto a Fast Fourier Transform with zero-padding to generate an FFT output;
  (vi) obtaining the square of the absolute values of the FFT output to generate a frequency spectrum;
  (vii) searching the frequency spectrum to find a maximum-power frequency sample;
  (viii) performing a fine search for the carrier frequency error, by applying one step of a secant optimization process to the maximum-power frequency sample and the output of the normalized squared amplitude signal, when the type of envelope is identified as an irregular envelope;

(g) correcting the pre-processed signal for the carrier frequency errors to generate a carrier-corrected signal; and (h) classifying the type of modulation in the carrier-corrected signal, based on the type of envelope, by performing the steps of:
  (i) obtaining the direct phase variance for samples of the carrier-corrected signal above the mean amplitude of the carrier-corrected signal;
  (ii) comparing the direct phase variance to a predefined phase threshold; and
  (iii) classifying the type of modulation as Continuous Wave when the direct phase variance is below the phase threshold, and as Frequency Modulation when the direct phase variance is above the phase threshold, when the type of envelope is identified as a constant envelope, and by performing the step of classifying the type of modulation includes a step of obtaining from the carrier-corrected signal the variance of the absolute phase $\phi_a(t)=\angle(|I(t)|+j|Q(t)|)$ for signal samples above the mean signal amplitude, to classify the type of modulation when the absolute phase variance is below a predefined phase threshold as being one of Amplitude Modulation, Double Sideband Suppressed Carrier, and Binary Phase Shift Keying, and, when the absolute phase variance is above a pre-defined phase threshold, as being one of Quarternary Phase Shift Keying (QPSK), π/4-QPSK, M-ary PSK, and OTHER, when the type of envelope is identified as an irregular envelope.

20. A system for recognizing the type of modulation of a modulated signal having a carrier frequency comprising:
  (a) a receiver section for extracting from the modulated signal a complex baseband signal;
  (b) a pre-classification stage for generating a pre-processed signal from the baseband signal;
  (c) means for examining amplitude variations in the pre-processed signal to identify the type of envelope thereof as being one of a constant envelope and an irregular envelope;
  (d) means for estimating the carrier frequency error in the pre-processed signal;
  (e) means for correcting the pre-processed signal for the carrier frequency errors to generate a carrier-corrected signal; and
  (f) means for classifying the type of modulation in the carrier-corrected signal, based on the type of envelope identified in the examining step.

21. The system of claim 20, wherein the generating means include means for detecting presence of the baseband signal by estimating the power spectral density thereof with the aid of externally measured background noise power, and comparing said power spectral density against a power threshold derived from the background noise and a predefined probability of detection.

22. The system of claim 21, wherein the generating means further includes means for gross error correction of the carrier frequency.

23. The system of claim 22, wherein when the type of envelope is identified as a constant envelope, the type of modulation is classified according to the phase and frequency contents of the pre-processed and carrier-corrected signals.

24. The system of claim 22, wherein when the type of envelope is identified as an irregular envelope, the type of modulation is classified according to the phase and amplitude contents of the carrier-corrected signal.

* * * * *

UNITED STATES PATENT AND TRADEMARK OFFICE
CERTIFICATE OF CORRECTION

PATENT NO. : 7,428,270 B1
APPLICATION NO. : 09/504676
DATED : September 23, 2008
INVENTOR(S) : Christian Dubuc et al.

It is certified that error appears in the above-identified patent and that said Letters Patent is hereby corrected as shown below:

In the drawings, Sheet 1, Figure 1, in Block 7, delete "Sampling at $F_s$" and insert therefor --Analog to Digital Conversion--.

In the drawings, Sheet 2, Figure 2, a downward-pointing arrow line labeled "29" should be added between the bottom end of block 27 and the top end of block 31; in Block 20, delete "Bandwidth and central frequency estimation" and insert therefor --Bandwidth and centroid frequency estimation--;

In the drawings, Sheet 5, Figure 5, add the label --28-- to the arrow line in the bottom right-hand corner of the drawing.

Figure 7:
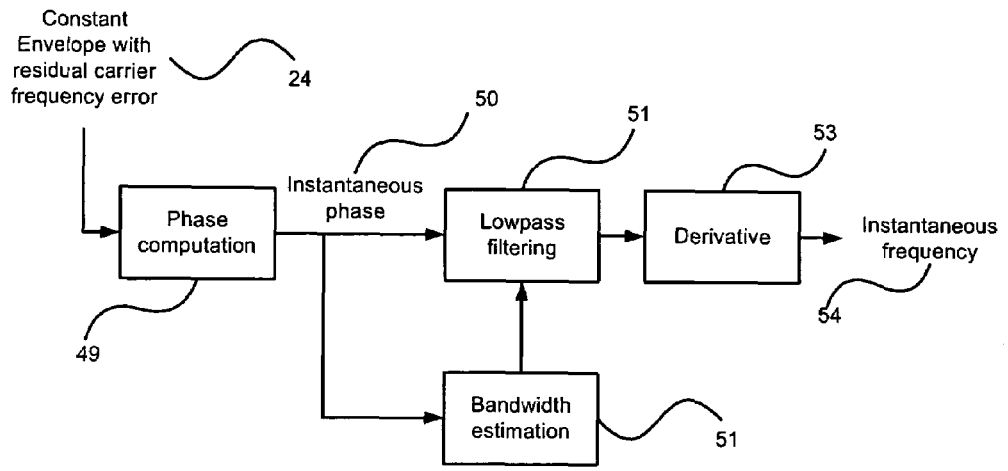
FIG. 7 is a block diagram illustrating the signal processing functions for generating the instantaneous frequency components of a constant envelope signal in the phase processor block 42 of FIG. 6.

In the drawings, Sheet 7, Figure 7, delete "Constant Envelope with residual carrier frequency error" and insert therefor --Constant envelope signal with residual carrier frequency error--; in the block containing the phrase "Lowpass Filtering", delete the label "51" and insert therefor --52--.

In the drawings, Sheet 10, Figure 11, in block 20, delete "Bandwidth and central frequency estimation" and insert therefor --Bandwidth and centroid frequency estimation--; in block 46, delete "More than one peak in the FFP of the squared signal?" and insert therefor --More than one peak in the FFT of the squared signal?--; in the block directly below block 47 in the bottom right-hand corner of the figure, delete "FM" and insert therefor --FSK--.

Column 7, line 59, delete "$e^{j3\pi f_c t}$" and insert therefor --$e^{j2\pi f_c t}$--.

Column 9, line 27, delete "cross" and insert therefor --gross--.

Column 12, line 40, delete "50,".

Column 13, line 12, delete "$F_{sym}$" and insert therefor --$f_{sym}$--.

UNITED STATES PATENT AND TRADEMARK OFFICE
CERTIFICATE OF CORRECTION

PATENT NO. : 7,428,270 B1
APPLICATION NO. : 09/504676
DATED : September 23, 2008
INVENTOR(S) : Christian Dubuc et al.

It is certified that error appears in the above-identified patent and that said Letters Patent is hereby corrected as shown below:

Column 20, table 1, delete "($\square_{max}$)" and insert therefor --($\gamma_{max}$)--.

Signed and Sealed this

Twenty-second Day of September, 2009

David J. Kappos
*Director of the United States Patent and Trademark Office*